US011742285B2

(12) United States Patent
Doornbos et al.

(10) Patent No.: US 11,742,285 B2
(45) Date of Patent: *Aug. 29, 2023

(54) SEMICONDUCTOR DEVICE INCLUDING BACK SIDE POWER SUPPLY CIRCUIT

(71) Applicant: TAIWAN SEMICONDUCTOR MANUFACTURING COMPANY, LTD., Hsinchu (TW)

(72) Inventors: Gerben Doornbos, Kessel-Lo (BE); Marcus Johannes Henricus Van Dal, Linden (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 54 days.

This patent is subject to a terminal disclaimer.

(21) Appl. No.: 17/316,358

(22) Filed: May 10, 2021

(65) Prior Publication Data
US 2021/0265260 A1 Aug. 26, 2021

Related U.S. Application Data

(63) Continuation of application No. 16/587,671, filed on Sep. 30, 2019, now Pat. No. 11,004,789.

(51) Int. Cl.
H01L 23/528 (2006.01)
H01L 23/48 (2006.01)
(Continued)

(52) U.S. Cl.
CPC .......... H01L 23/528 (2013.01); H01L 23/481 (2013.01); H01L 27/0924 (2013.01);
(Continued)

(58) Field of Classification Search
None
See application file for complete search history.

(56) References Cited

U.S. PATENT DOCUMENTS 9,412,871 B2   8/2016   Doornbos et al.
10,068,874 B2  9/2018   Nelson et al.
(Continued)

FOREIGN PATENT DOCUMENTS

EP   3671859 A1        6/2020
KR   10-2017-0018813 A 2/2017
(Continued)

OTHER PUBLICATIONS

Khaja Ahmad Shaik, "Buried Power Rail and PDN in SOC Context for IN5:SRAM and Logic," Logic Insite Y106, IMEC Partner Technical Week, 37 pgs, Oct. 2018.
(Continued)

Primary Examiner — Robert K Carpenter
(74) Attorney, Agent, or Firm — McDermott Will & Emery LLP

(57) ABSTRACT

A semiconductor device includes a substrate, a main circuit disposed over a front surface of the substrate, and a backside power delivery circuit disposed over a back surface of the substrate. The backside power delivery circuit includes a first main power supply wiring for supplying a first voltage, a second main power supply wiring for supplying a second voltage, a first local power supply wiring, and a first switch coupled to the first main power supply wiring and the first local power supply wiring. The first main power supply wiring, the second main power supply wiring and the first local power supply wiring are embedded in a first back side insulating layer disposed over the back surface of the substrate. The first local power supply wiring is coupled to the main circuit via a first through-silicon via (TSV) passing through the substrate for supplying the first voltage.

20 Claims, 29 Drawing Sheets

(51) Int. Cl.
  *H01L 27/092* (2006.01)
  *H01L 29/417* (2006.01)
  *H01L 29/423* (2006.01)
  *H01L 29/786* (2006.01)

(52) U.S. Cl.
  CPC .. *H01L 29/41733* (2013.01); *H01L 29/42384* (2013.01); *H01L 29/786* (2013.01)

(56) References Cited

U.S. PATENT DOCUMENTS

| | | |
|---|---|---|
| 10,380,315 B2 | 8/2019 | Zhuang et al. |
| 10,700,039 B2 | 6/2020 | Nelson et al. |
| 11,004,789 B2 * | 5/2021 | Doornbos ............. H01L 29/786 |
| 2012/0181596 A1 | 7/2012 | Liu |
| 2016/0099297 A1 | 4/2016 | Bedell et al. |
| 2018/0145030 A1 | 5/2018 | Beyne et al. |

FOREIGN PATENT DOCUMENTS

| | | |
|---|---|---|
| KR | 10-2017-0021229 A | 2/2017 |
| KR | 10-2018-0030450 A | 3/2018 |
| TW | 201633508 A | 9/2016 |

OTHER PUBLICATIONS

Stephen Kosonocky, "Practical Power Gating and Dynamic Voltage/ Frequency Scaling," AMD, pp. 1-62, Aug. 17, 2011.
Notice of Allowance issued in U.S. Appl. No. 16/587,671, dated Jan. 14, 2021.

* cited by examiner

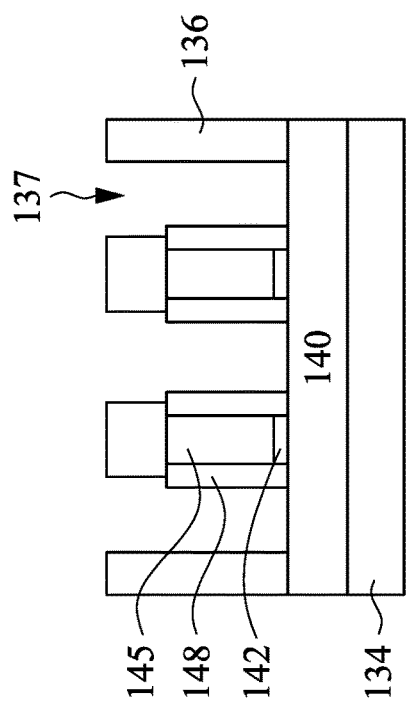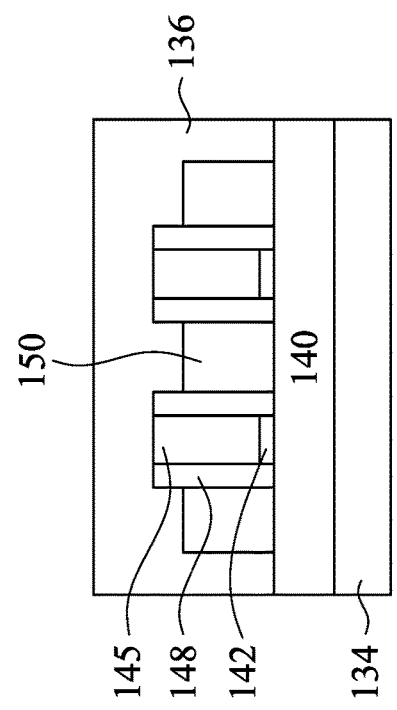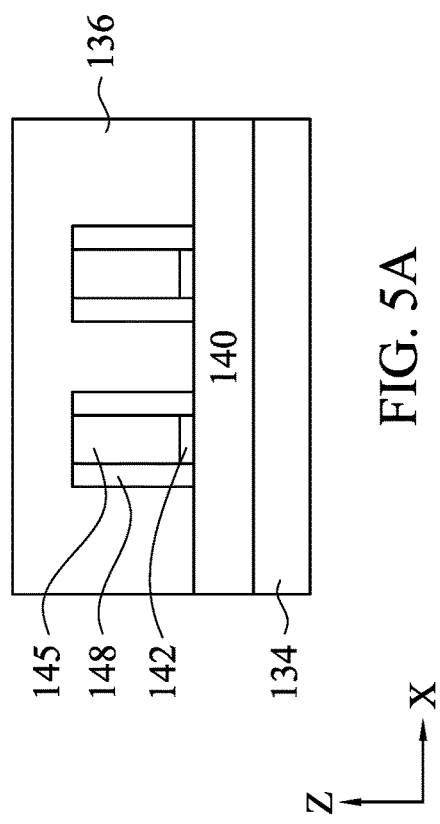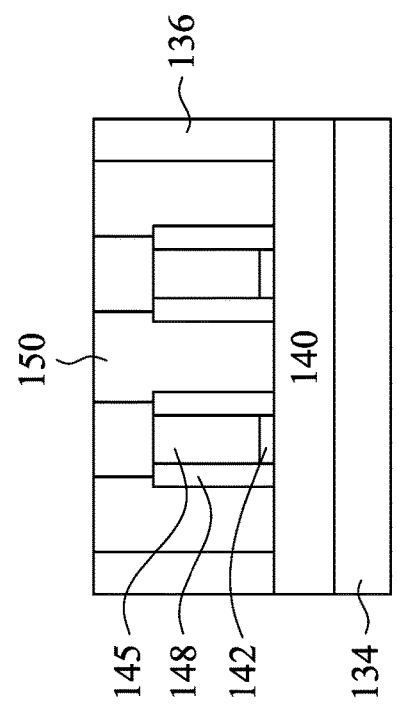

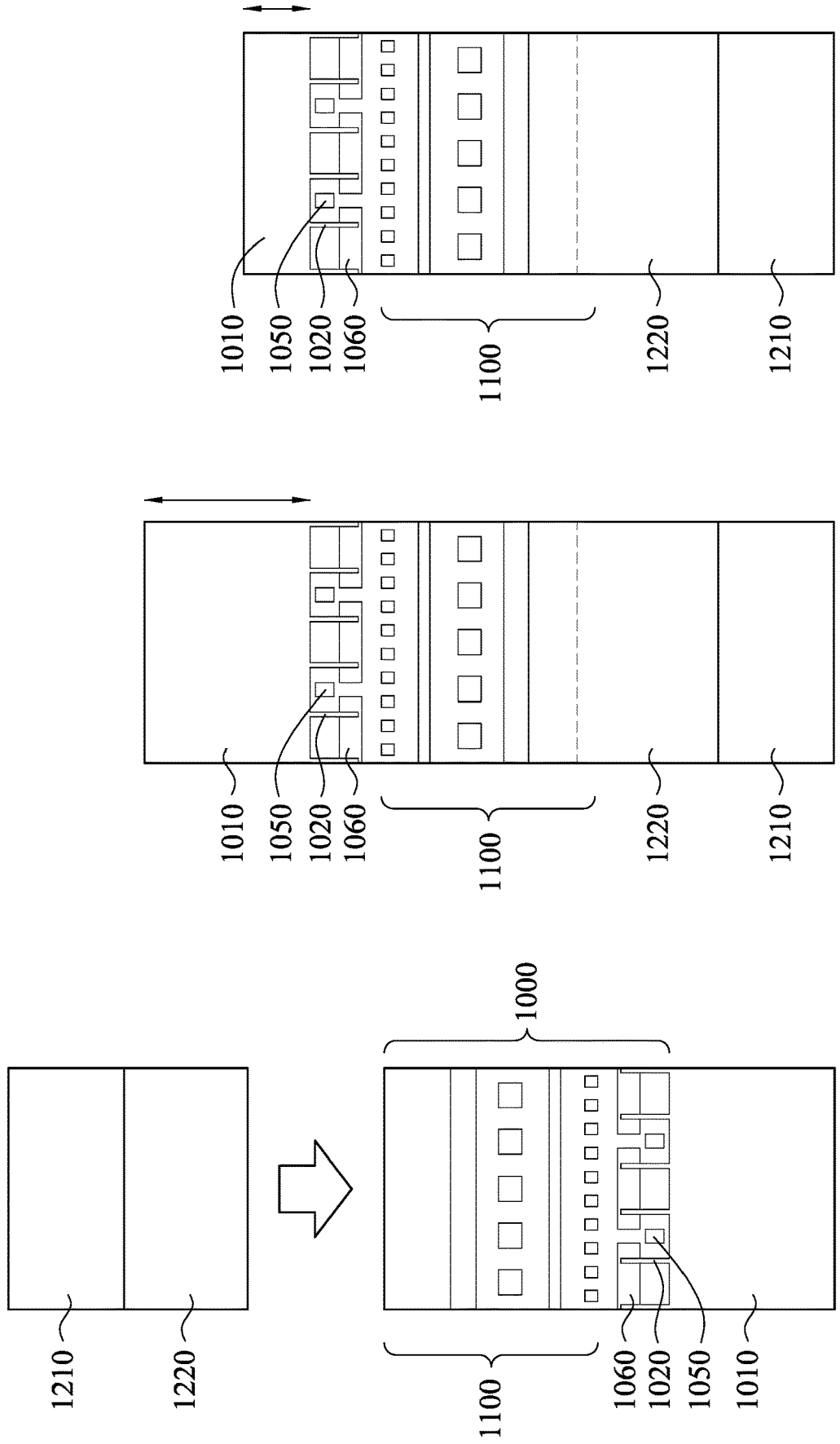

SEMICONDUCTOR DEVICE INCLUDING BACK SIDE POWER SUPPLY CIRCUIT

RELATED APPLICATIONS

This application is a continuation of U.S. patent application Ser. No. 16/587,671 filed on Sep. 30, 2019, now U.S. Pat. No. 11,004,789, the entire content of which is incorporated herein by reference.

BACKGROUND

As the size of semiconductor devices becomes smaller, a cell height of standard cells also becomes smaller. The cell height is generally defined as a periodic distance (pitch) between two power supply lines, VDD and VSS, and is generally determined by the number and a pitch of fin structures and/or metal lines. The cell height is also called a track height. Typical track heights are 7.5T, 6.5T or 5.5T, where T is a smallest pitch of metal lines running over the standard cell. Scaling down to 4.5T or 4T is currently required to further minimize the size of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A, 5B, 5C and 5D show cross sectional views illustrating a manufacturing operation of a back side power supply circuit according to an embodiment of the present disclosure.

FIGS. 18A, 18B and 18C show cross sectional views illustrating a manufacturing operation of a semiconductor device with a backside power supply circuit according to an embodiment of the present disclosure.

DETAILED DESCRIPTION

Figure 1:
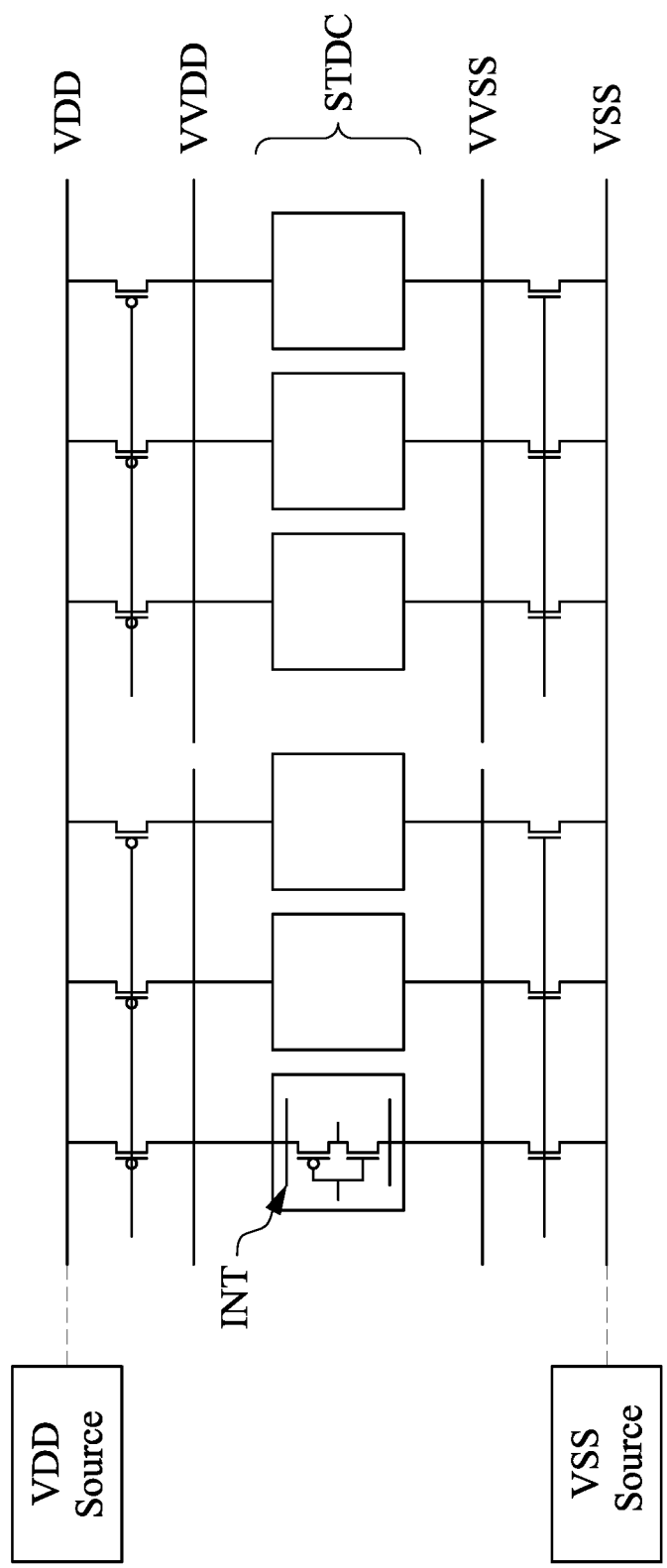
FIG. 1 shows a circuit diagram of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

Minimization of power consumption in a semiconductor device, such as an integrated circuit (IC), is a critical issue for semiconductor devices for high speed operations of and/or semiconductor devices for mobile terminals. Various technologies to reduce the power consumption have been proposed, but many of them require a larger chip area due to additional circuitry for controlling power. One such technology includes providing a virtual power supply line (VVDD and/or VVSS) together with adding a header switch and/or a footer switch between a main power supply line (VDD and/or VSS) and the virtual power supply line. The virtual power supply line may be called a local power supply line, while the main power supply line may be called a global power supply line. It is noted that VDD is generally a higher potential (voltage) than VSS, and in some embodiments, VSS is coupled to the ground (0 V). The power consumption is reduced by turning-off the header/footer switch coupled to a non-active functional circuit in the semiconductor device.

FIG. 1 shows a circuit diagram of a semiconductor device according to an embodiment of the present disclosure. As shown in FIG. 1, a p-type MOS FET is used as a header switch to shut off the power supply to the local VDD, and an n-type MOS is used as a footer switch to shut off the power supply to the local VSS which further supplies power to blocks of one or more standard cells STDC, each including a functional circuit (e.g., an CMOS inverter). In some embodiments, no footer switch is used and the standard cells are directly coupled to the VSS. In other embodiments, no header switch is used and the standard cells are directly coupled to the VDD. In some embodiments, as shown in FIG. 1, a first main power supply line VDD is coupled to a VDD generation circuit (VDD Source) which generates a voltage, such as 0.5 V, 0.8V, 1.0V, 1.2 V, 1.8 V, 2.4 V, 3.3 V or 5.0 V. A second main power supply line VSS is coupled to a VSS generation circuit (VSS Source) which generates a voltage lower than VDD, or the ground, in some embodiments. As shown in FIG. 1, the local power supply lines VVDD and/or VVSS are divided into a plurality of local power supply lines, to each of which one or more standard cells STDC are connected, as a cell block. Accordingly, power supply to the standard cell can be controlled on a block-by-block basis. Further, in some embodiments, the standard cells STDC includes an internal power supply line (bus line) INT, and the local power supply line VVDD is coupled to the internal power supply line with or without a switch.

In this disclosure, a semiconductor device includes a substrate, a main circuit disposed over a front surface of the substrate and a backside power delivery circuit disposed over a back surface of the substrate. The front side circuit includes functional circuits of the standard cell. The backside power delivery circuit includes the first main power supply line VDD, the second main power supply line VSS and a local power supply line VVDD. Further, the backside power delivery circuit includes one or more switches coupled to the first main power supply line VDD and the local power supply line VVDD to connect and disconnect the first main power supply line VDD to and from the local power supply line VVDD. The front side main circuit includes one or more buried conductive line explained below, and the local power supply line VVDD is coupled to one of the buried conductive line of the main circuit via one or more through-silicon vias (TSVs) passing through the substrate.

Figure 2A:
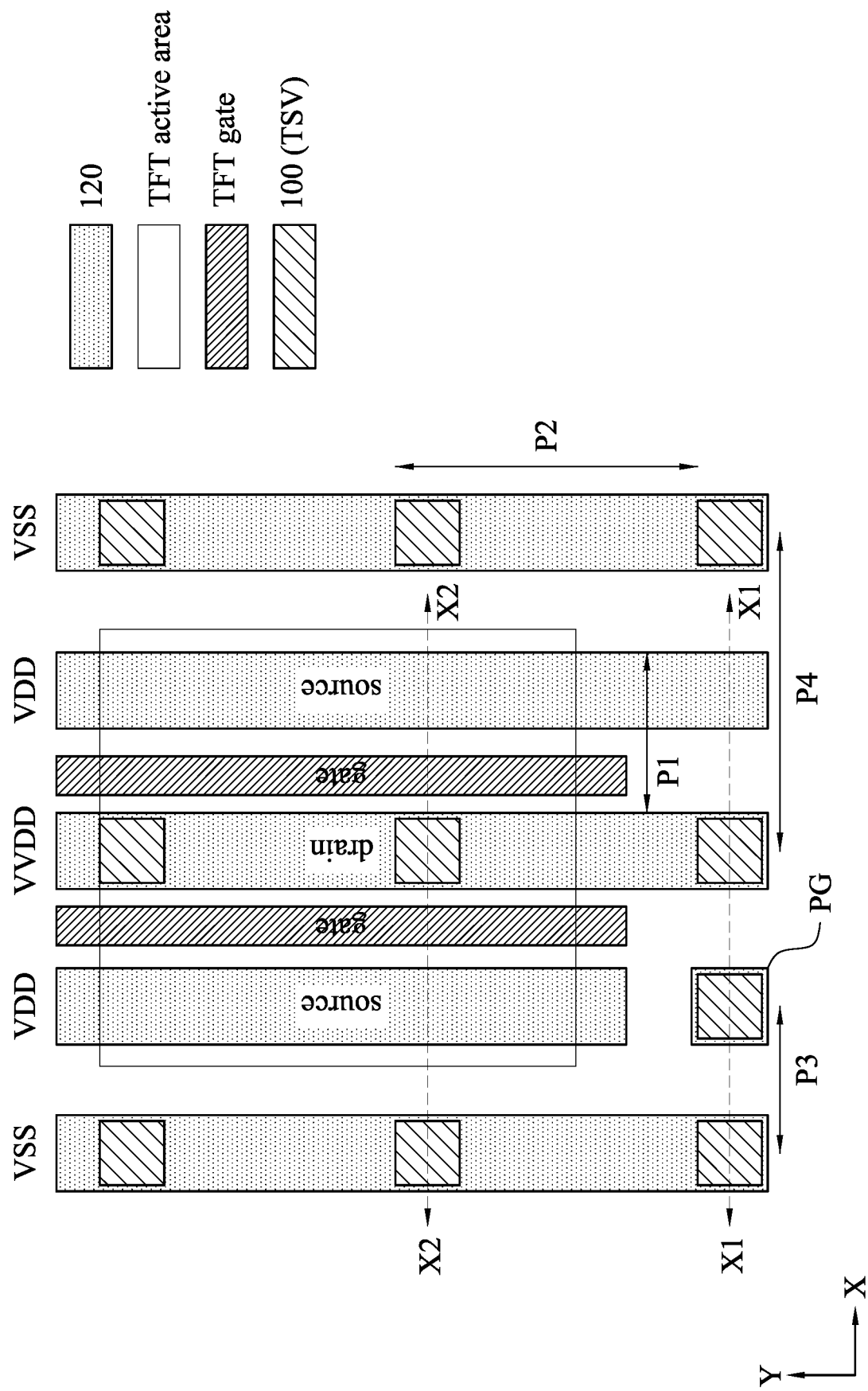
FIG. 2A shows a layout of a back side power supply circuit according to an embodiment of the present disclosure.
Figure 2C:
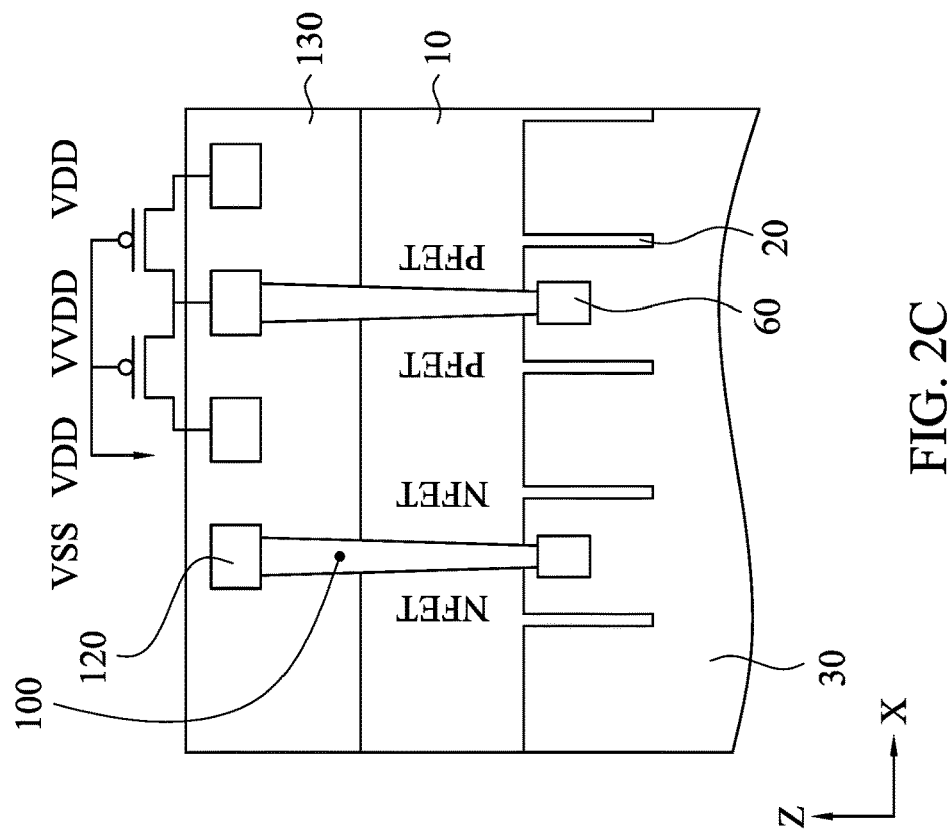
FIGS. 2B and 2C show cross sectional views of a back side power supply circuit according to an embodiment of the present disclosure.
Figure 2B:
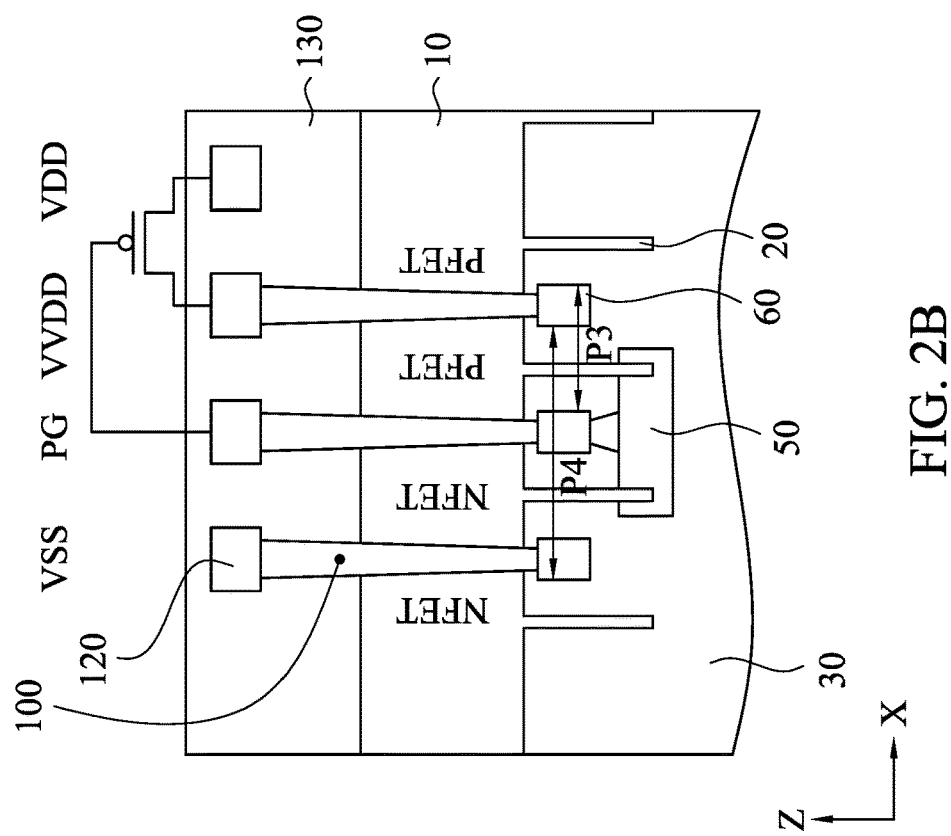

FIG. 2A shows a layout of a back side power supply circuit, and FIGS. 2B and 2C show cross sectional views of a back side power supply circuit according to an embodiment of the present disclosure. FIG. 2B corresponds to the line X1-X1 of FIG. 2A and FIG. 2C corresponds to the line X2-X2 of FIG. 2A.

As shown in FIGS. 2B and 2C, back side metal wirings 120 are embedded in a back side insulating layer 130 formed on the back surface of the substrate 10. The back side metal wirings 120 includes a first main power supply wiring (line) VDD, a second main power supply wiring (line) VSS and a local power supply wiring (line) VVDD, as shown in FIGS. 2A-2C. In some embodiments, two first main power supply wirings VDD are provided on both sides of the local power supply wiring VVDD. The first and second main power supply wirings and the local power supply wiring line extend in the Y direction, and one of the first main power supply wirings VDD is disposed between the local power supply wiring VVDD and the second main power supply wiring VSS along the X direction, as shown in FIG. 2A. The wirings VSS, VDD, VVDD and VDD are arranged with a constant pitch P1, and the arrangement of the wirings VSS, VDD, VVDD and VDD are repeated in the X direction so that all wirings are arranged in a constant pitch, in some embodiments. In some embodiments, the widths of the wirings VSS, VDD, VVDD and VDD are all the same.

The second main power supply wiring VSS is connected to a buried conductive wiring (line) 60 formed at the front side of the substrate 10 by a through-silicon via (TSV) 100 as shown in FIGS. 2B and 2C. Two or more TSVs 100 are arranged with a constant pitch P2 along the Y direction as shown in FIG. 2A in some embodiments. Similarly, the local power supply wiring VVDD is connected to another buried conductive wiring 60 by a TSV 100 as shown in FIGS. 2B and 2C. Two or more TSVs 100 are arranged with a constant pitch P2 along the Y direction as shown in FIG. 2A in some embodiments. As shown in FIG. 2A, no TSV is arranged to overlap the first main power supply wirings VDD in some embodiments. Thus, the first main power supply wirings VDD is electrically connected to the front side circuit only via the local power supply wiring VVDD. The buried conductive wiring may also be called a buried power rail.

Figure 3A:
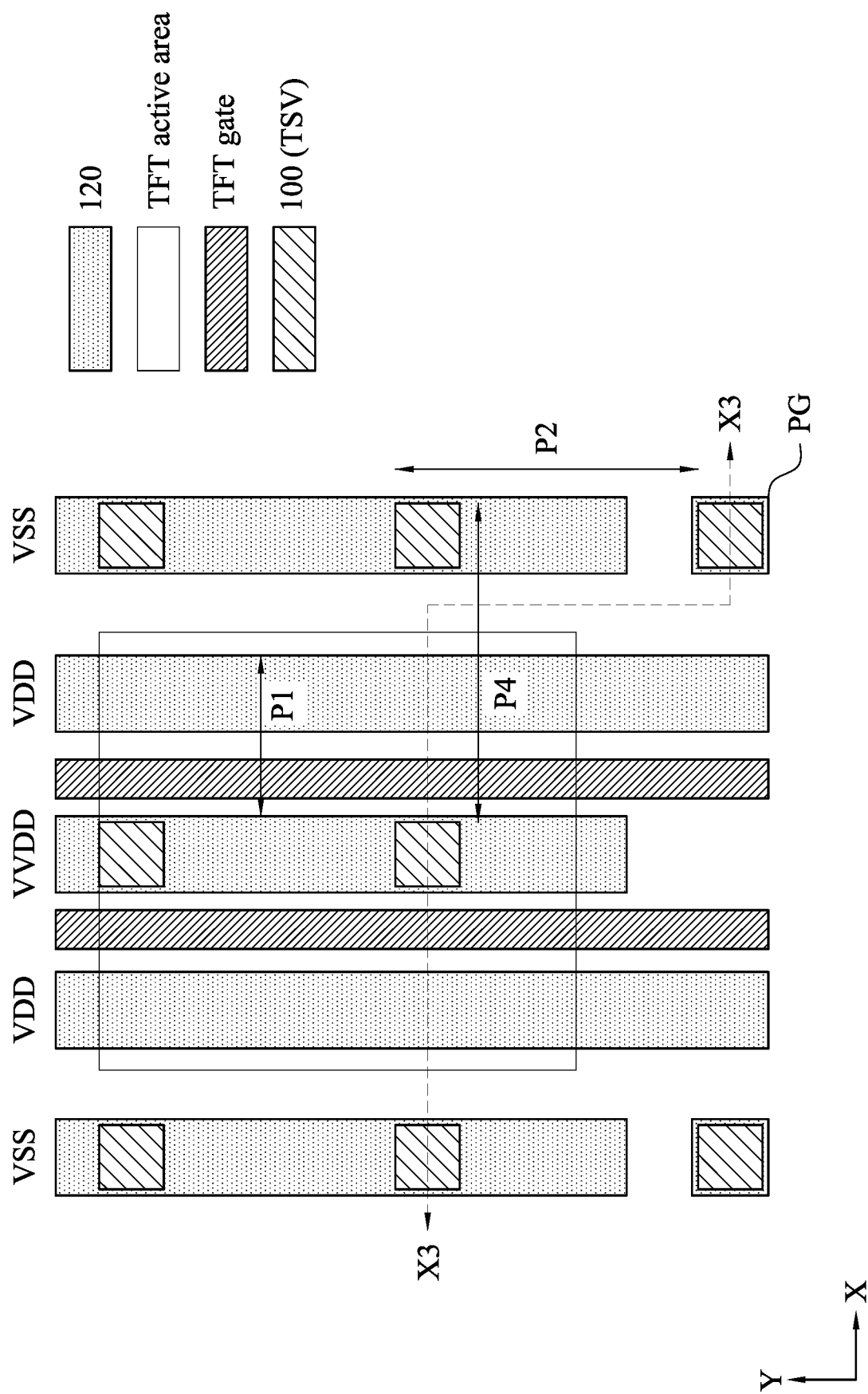
FIG. 3A shows a layout of a back side power supply circuit according to an embodiment of the present disclosure.

The back side power supply circuit also includes a switch, such as a transistor. In some embodiments, the transistor is a field effect transistor (FET), such as a thin film transistor (TFT). The TFT includes a semiconductor layer as a TFT active area, and includes a source region, a drain region and a gate electrode. The TFT active area (semiconductor layer) is disposed over or is patterned to be disposed over the first main power supply wirings VDD and the local power supply wiring VVDD as shown in FIG. 3A in some embodiments. The source region of the TFT is coupled to one of or both of the first main power supply wirings VDD, and the drain region of the TFT is coupled to the local power supply wiring VVDD, as shown in FIGS. 2B and 2C. The gate electrodes are located between the first main power supply wiring VDD and the local power supply wiring VVDD in plan view, as shown in FIG. 2A. The gate electrode is coupled to the gate contact pad PG formed by the same wiring layer as the wirings VS S, VDD and VVDD, and the gate contact pad PG is connected to a buried conductive wiring 60 by a TSV 100 as shown in FIG. 2B. The buried conductive wiring 60 connected to the gate contact pad PG is further coupled to drains (or sources) of a p-type FET and an n-type FET disposed at the front side of the substrate 10 by a source/drain contact pattern 50. In some embodiments, the p-type and n-type FETs are fin FETs (FinFETs), each including one or more fin structures 20 covered by one or more insulating layers 30. As an output of a CMOS logic control circuit formed by the p-type and n-type FinFETs, a gate control signal is supplied to the gate electrode of the TFT through the TSV 100 and the gate contact pad PG.

In some embodiments, the gate contact pad PG is an island pattern separated from and aligned in the Y direction with the first main power supply line VDD as shown in FIG. 2A. In some embodiments, as shown in FIGS. 2A and 2B, along the line X1-X1, the pitch P3 of the TSVs 100 is the same as the pitch P1 of the wirings, which is a half of the pitch P4 of the TSVs in other locations. In some embodiments, the pitch P1 of the wirings in in a range from about 40 nm to about 120 nm and is in a range from about 60 nm to about 100 nm in other embodiments, depending of the design rule of the front side circuit.

As shown in FIGS. 2B and 2C, the TSV 100 connected to the second main power supply wiring VSS is connected to the buried conductive wiring 60 disposed between n-type FETs, and the TSV 100 connected to the second local power supply wiring VVDD is connected to the buried conductive wiring 60 disposed between p-type FETs. Further, the TSV 100 connected to the gate contact pad PG is located between an n-FET and a p-FET, and thus it is possible to directly connect the output of the CMOS logic control circuit to the TSV 100.

Figure 3B:
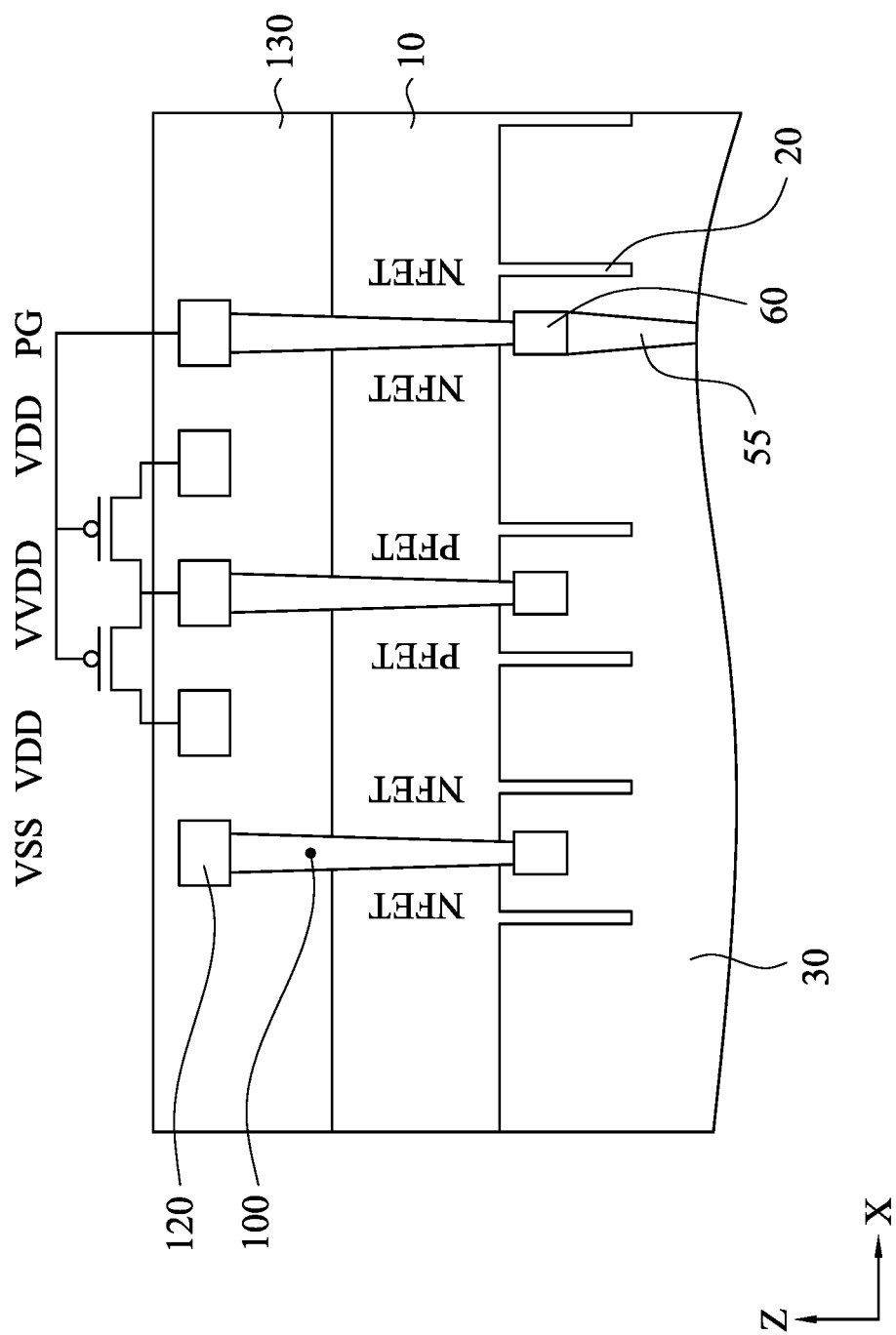
FIGS. 3B and 3C show cross sectional views of a back side power supply circuit according to an embodiment of the present disclosure.
Figure 3C:
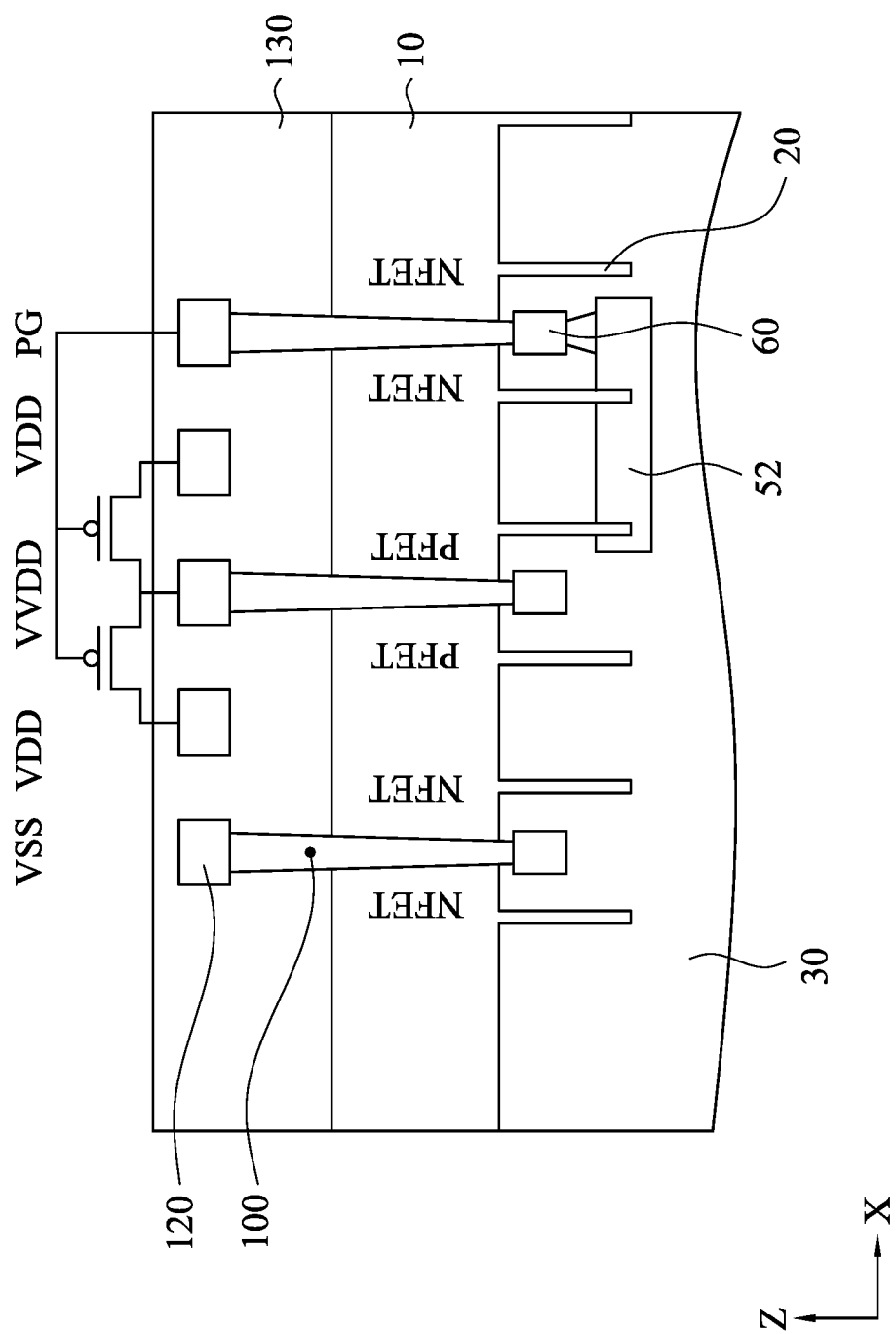

FIG. 3A shows a layout of a back side power supply circuit, and FIGS. 3B and 3C show cross sectional views of a back side power supply circuit according to an embodiment of the present disclosure. FIGS. 3B and 3C correspond to the line X3-X3 of FIG. 3A. Materials, configurations, dimensions, processes and/or operations as explained with respect to the foregoing embodiments may be employed in the following embodiments, and the detailed description thereon may be omitted.

In the embodiment of FIGS. 3A-3C, unlike the embodiments of FIGS. 2A-2C, all the TSVs 100 are arranged with a pitch P4 in the X direction, which is twice the pitch P1 of the wirings. The gate contact pad PG is disposed at an end of the second main power supply wiring VSS and is aligned with the second main power supply wiring VSS in the Y direction as shown in FIG. 3A. The TSV 100 connected to the gate contact pad PG is connected to a buried conductive wiring 60 located between the same conductivity type FETs (e.g., n-type FETs) as shown in FIGS. 3B and 3C. Accordingly, to receive a gate control signal output from a CMOS logic control circuit, one or more routing wirings 55 formed above the FinFETs are utilized as shown in FIG. 3B, or a long source/drain contact pattern 52 connecting drains of the p-type FET and n-type FET is utilized as shown in FIG. 3C. In this configuration, forming TSVs 100 is easier than the configuration of FIG. 2A because there is no half-pitch TSV.

Figure 4A:
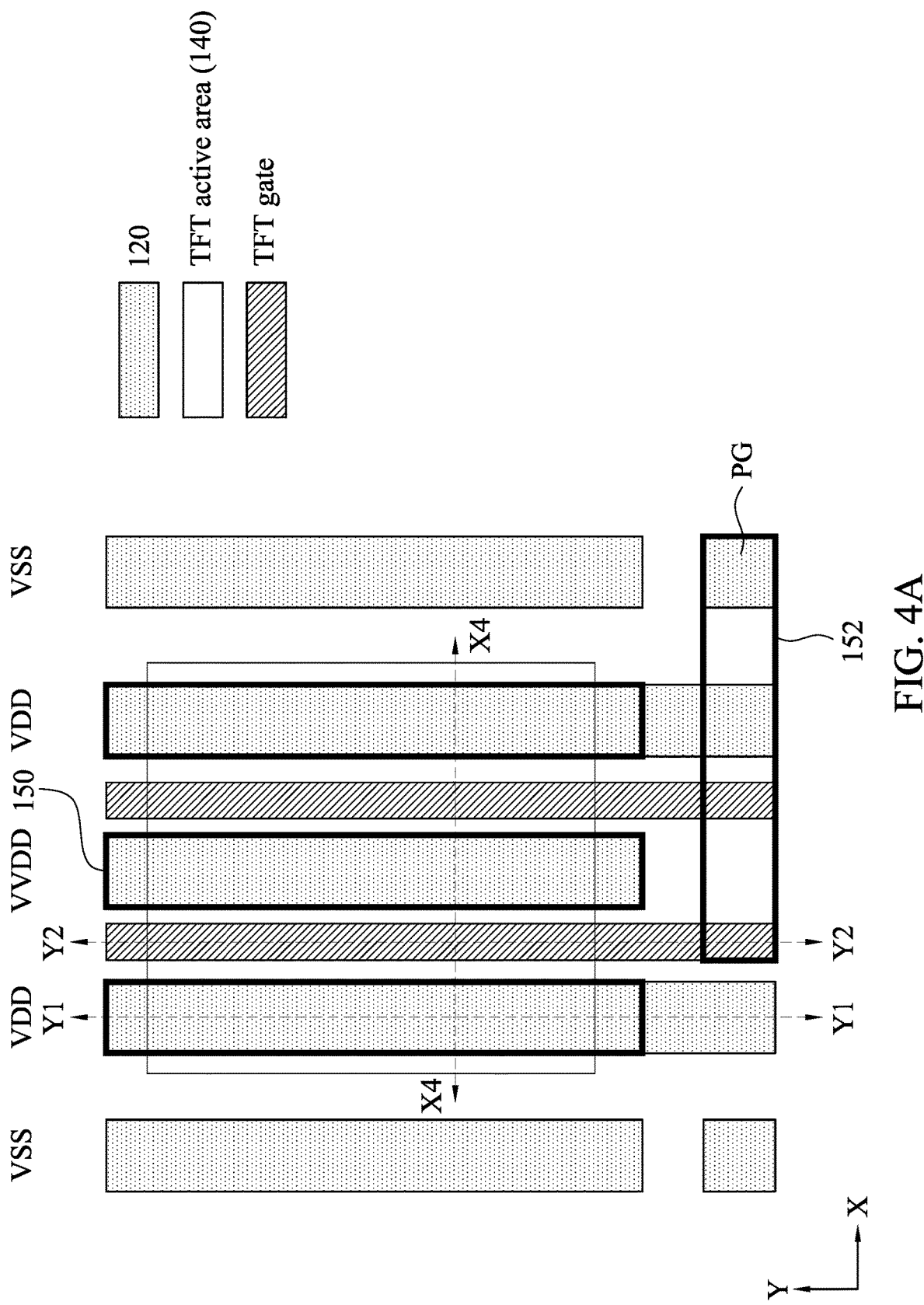
FIG. 4A shows a layout of a back side power supply circuit according to an embodiment of the present disclosure.
Figure 4C:
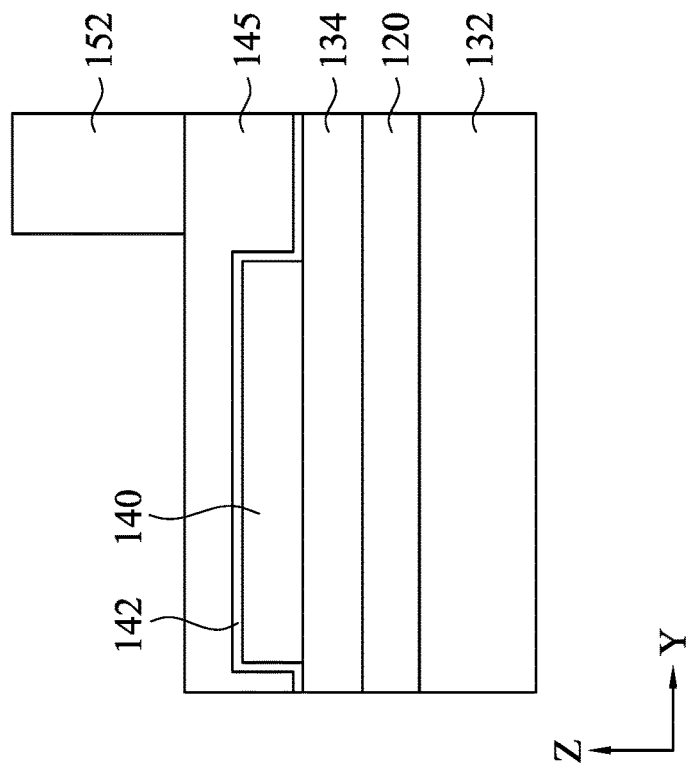
FIGS. 4B, 4C and 4D show cross sectional views of a back side power supply circuit according to an embodiment of the present disclosure.
Figure 4B:
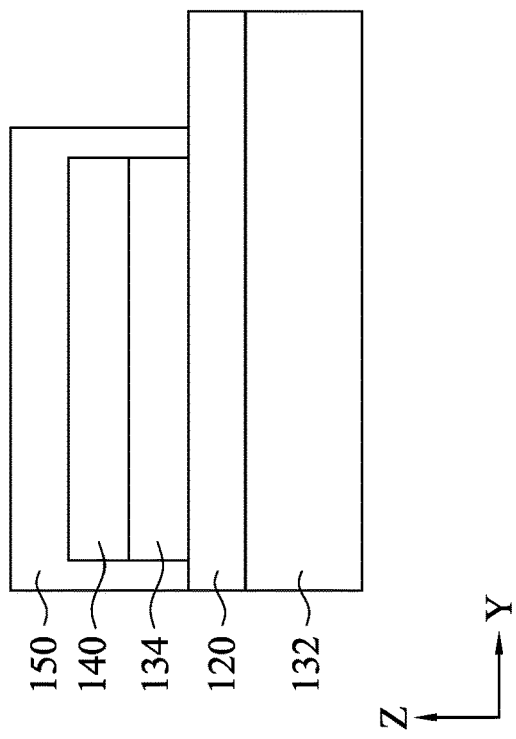
Figure 4D:
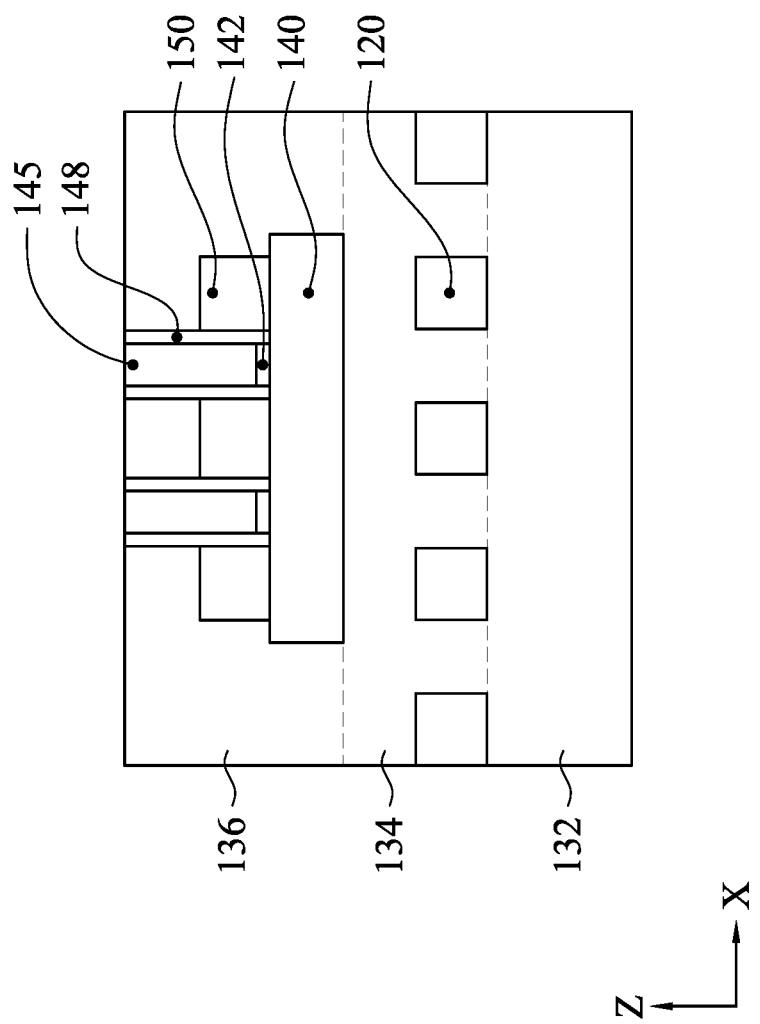

FIG. 4A shows a layout of a back side power supply circuit according to an embodiment of the present disclosure. FIGS. 4B, 4C and 4D show cross sectional views of a back side power supply circuit according to an embodiment of the present disclosure. FIG. 4A is a layout similar to FIG. 3 showing a TFT structure, and also shows conductive patterns 150. FIG. 4B corresponds to the lines Y1-Y1 of FIG. 4A, FIG. 4C corresponds to the line Y2-Y2 of FIG. 4A, and FIG. 4D corresponds to the line X4-X4 of FIG. 4A. Materials, configurations, dimensions, processes and/or operations as explained with respect to the foregoing embodiments may be employed in the following embodiments, and the detailed description thereon may be omitted. In FIG. 4A, TSVs are omitted.

The TFT includes a semiconductor layer 140 as a TFT active area, and includes a source region, a drain region and a gate electrode. The TFT active area (semiconductor layer) is disposed over or is patterned to be disposed over the first main power supply wirings VDD and the local power supply wiring VVDD as shown in FIG. 4A in some embodiments.

As shown in the cross sectional views, the wirings 120 are disposed on a first back side interlayer dielectric (ILD) layer 132 and the semiconductor layer 140 is formed over a second back side ILD layer 134 formed over the wirings 120. Thus, the wirings 120 are buried in the ILD layers 132 and 134. The ILD layers include one or more of silicon dioxide ($SiO_2$), SiON, SiOC and SiOCN or other suitable insulating material.

The semiconductor layer 140 includes one or more of, crystalline, polycrystalline or amorphous semiconductors, those semiconductors being silicon (Si), silicon germanium (SiGe) indium-gallium-zinc oxide (IGZO), $Ga_2O_3$, $MoS_2$ and $WSe_2$. The thickness of the semiconductor layer 140 is in a range from about 5 nm to about 50 nm in some embodiments and is in a range from about 10 nm to about 20 nm in other embodiments, depending on a drive current requirement, a breakdown voltage requirement or other circuit design. In plan view, the size of the semiconductor layer 140 in the X direction is in a range from about 180 nm to about 300 nm to cover the two first main power supply wirings VDD and the local power supply line VVDD in some embodiments. The size of the semiconductor layer 140 in the Y direction is about 1 μm to about 20 μm or more in some embodiments. The semiconductor layer 140 can be formed by chemical vapor deposition (CVD), atomic layer deposition (ALD), physical vapor deposition (PVD), or any other suitable film formation methods.

A gate dielectric layer 142 is disposed over the channel region of the semiconductor layer 140 and a gate electrode 145 is disposed over the gate dielectric layer 142. In some embodiments, the gate dielectric layer 142 includes one or more high-k dielectric layers (e.g., having a dielectric constant greater than 3.9) in some embodiments. For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN ($Si_3N_4$), $Al_2O_3$, $La_2O_3$, $Ta_2O_3$, $Y_2O_3$, $HfO_2$, $ZrO_2$, $GeO_2$, $Hf_xZr_{1-x}O_2$, $Ga_2O_3$, $Gd_2O_3$, $TaSiO_2$, $TiO_2$, HfSiON, $YGe_xO_y$, $YSi_xO_y$ and $LaAlO_3$, and the like. In certain embodiments, $HfO_2$, $ZrO_2$ and/or $Hf_xZr_{1-x}O_2$ is used. The formation methods of the gate dielectric layer 142 include molecular-beam deposition (MBD), ALD, PVD, CVD, or any other suitable methods. In some embodiments, the gate dielectric layer 142 has a thickness of about 1.0 nm to about 5.0 nm. The gate electrode 145 includes one or more conductive materials, such as W, Cu, Ti, Ag, Al, TiAl, TiAlN, TaC, TaCN, TaSiN, Mn, Co, Mo, Pd, Ni, Re, Ir, Ru, Pt, and Zr. The gate electrode 145 can be formed by ALD, PVD, CVD, plating or any other suitable methods. Further, gate sidewall spacers 148 are formed on opposing side faces of the gate electrode 145 as shown in FIG. 4D.

Source/drain contacts 150 are formed on the source region and the drain region of the semiconductor layer 140. As shown in FIG. 4B, the source/drain contact 150 is connected to a corresponding wiring 120 disposed below the source/drain contact 150. Thus, the source regions of the semiconductor layer 140 are connected to the first main power supply wirings VDD through the source/drain contacts 150, respectively, and the drain region of the semiconductor layer 140 is connected to the local power supply wiring VVDD through the source/drain contact 150. Further, a gate contact 152 is formed over the gate electrode 145 and connects the gate electrode 145 and the gate contact pad PG. The gate contact 152 and the source/drain contact 150 include one or more conductive materials, such as W, Cu, Ti, Ag, Al, TiAl, TiAlN, TaC, TaCN, TaSiN, Mn, Co, Mo, Pd, Ni, Re, Ir, Ru, Pt, and Zr. The gate contact 152 and the source/drain contact 150 can be formed by ALD, PVD, CVD, plating or any other suitable methods. The gate contact 152 is isolated from the first main power supply wiring VDD by an interlayer dielectric layer.

FIGS. 5A, 5B, 5C and 5D show cross sectional views illustrating an operation for manufacturing source/drain contacts 150 according to an embodiment of the present disclosure. As shown in FIG. 5A, after the gate electrode 145 and the gate sidewall spacers 148 are formed, a third back side ILD layer 136 is formed. The ILD layer 136 includes one or more of silicon dioxide ($SiO_2$), SiON, SiOC and SiOCN or other suitable insulating material.

Then, as shown in FIG. 5B, contact openings 137 are formed to expose the source/drain regions of the semiconductor layer 140. One or more conductive material layers are formed in the contact openings and then a planarization operation is performed to form the source/drain contacts 150, as shown in FIG. 5C. In some embodiments, the filled conductive material layers are further recessed such that a height of the source contact 150 measured from the semiconductor layer 140 is smaller than a height of the gate electrode 145 measured from the semiconductor layer 140 as shown in FIG. 5D. One or more additional dielectric layer is formed to cover the recessed source/drain contacts 150.

Figure 6A:
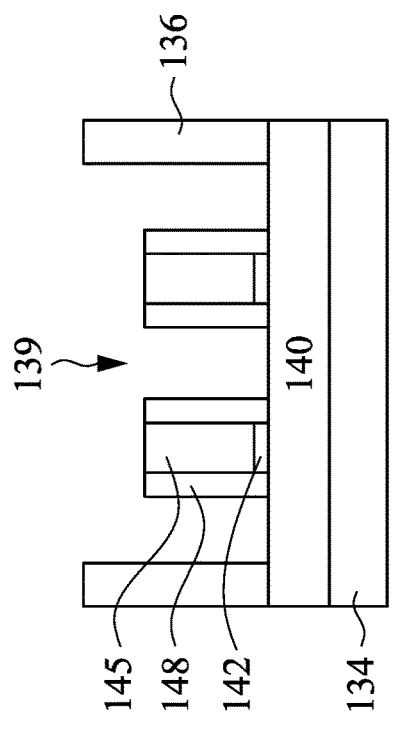
FIGS. 6A, 6B, 6C and 6D show cross sectional views illustrating a manufacturing operation of a back side power supply circuit according to an embodiment of the present disclosure.
Figure 6B:
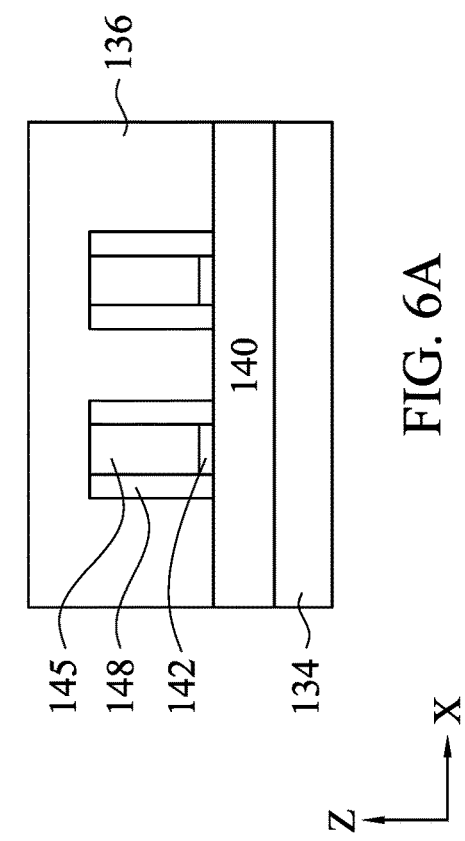
Figure 6C:
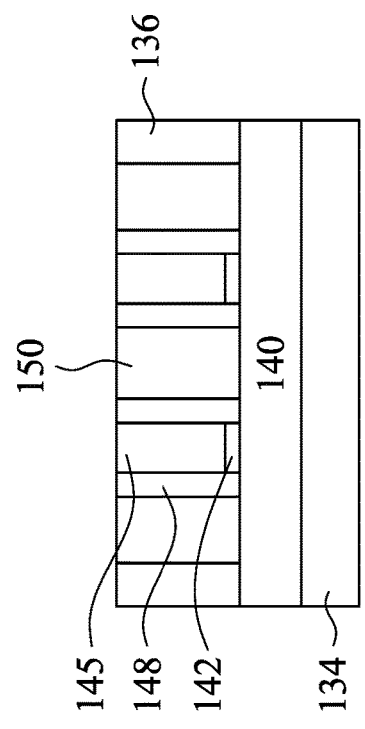
Figure 6D:
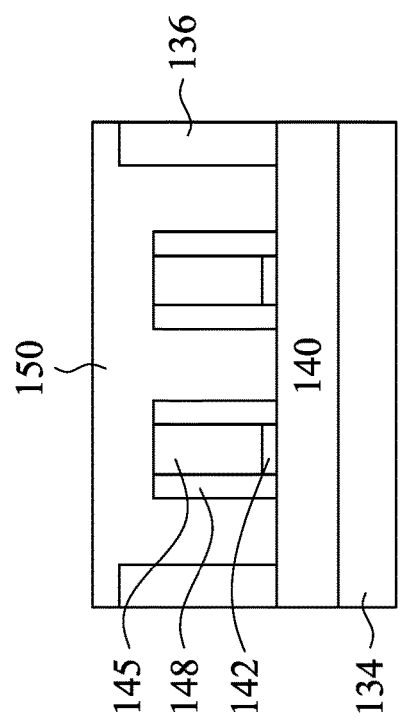

FIGS. 6A, 6B, 6C and 6D show cross sectional views illustrating an operation for manufacturing source/drain contact 150 according to another embodiment of the present disclosure. FIG. 6A is the same as FIG. 5A. As shown in FIG. 6B, an opening 139 is formed to expose the gate electrodes and the source/drain regions of the semiconductor layer 140. One or more conductive material layers are formed in the openings as shown in FIG. 6C, and then a planarization operation is performed to form the source/drain contacts 150, as shown in FIG. 6D. In some embodiments, a height of the source contact 150 measured from the semiconductor layer 140 is the same as a height of the gate electrode 145 measured from the semiconductor layer 140 as shown in FIG. 6D. One or more additional dielectric layer is formed to cover the source/drain contacts 150 and the gate electrode 145.

Figure 7A:
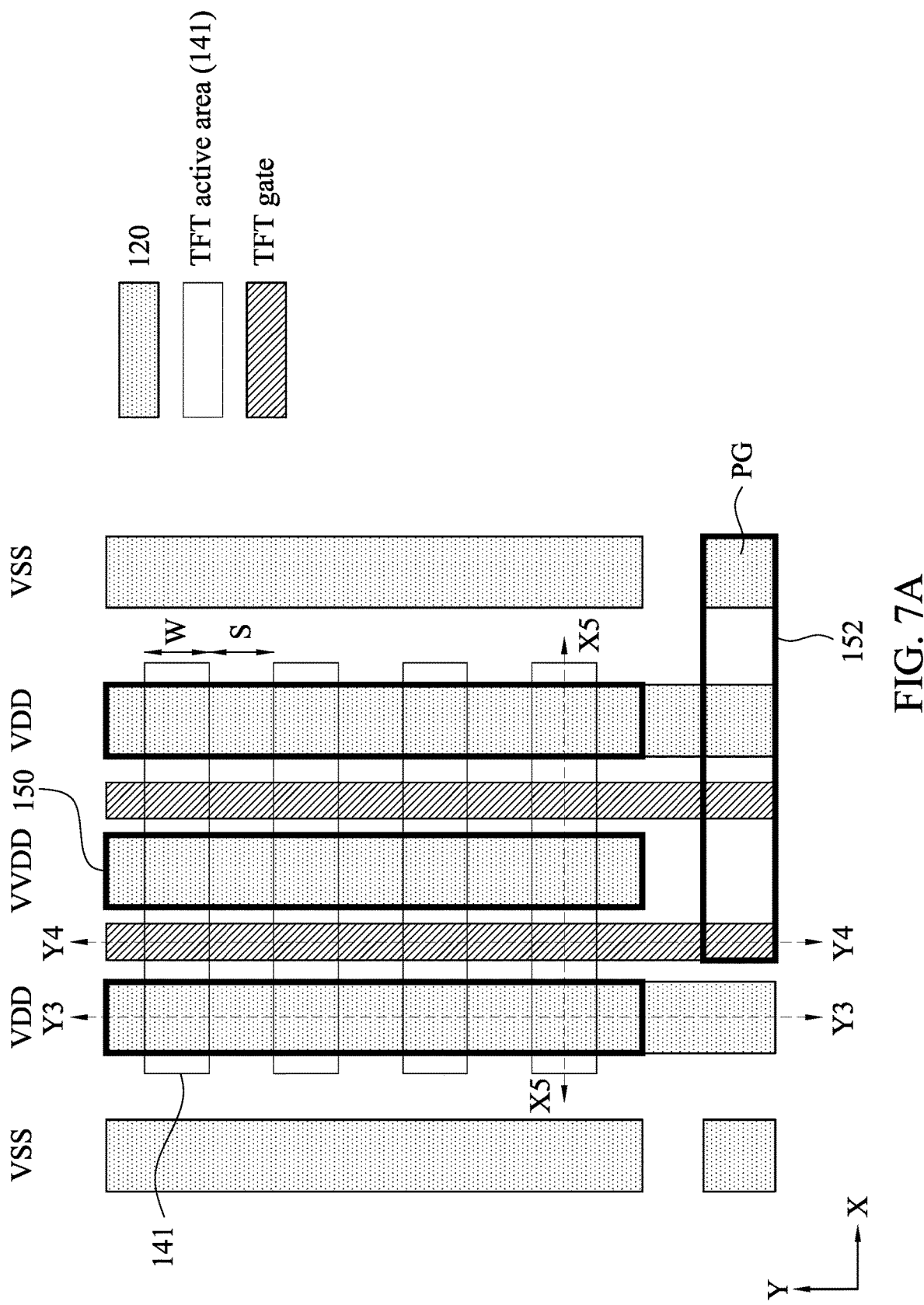
FIG. 7A shows a layout of a back side power supply circuit according to an embodiment of the present disclosure.
Figure 7C:
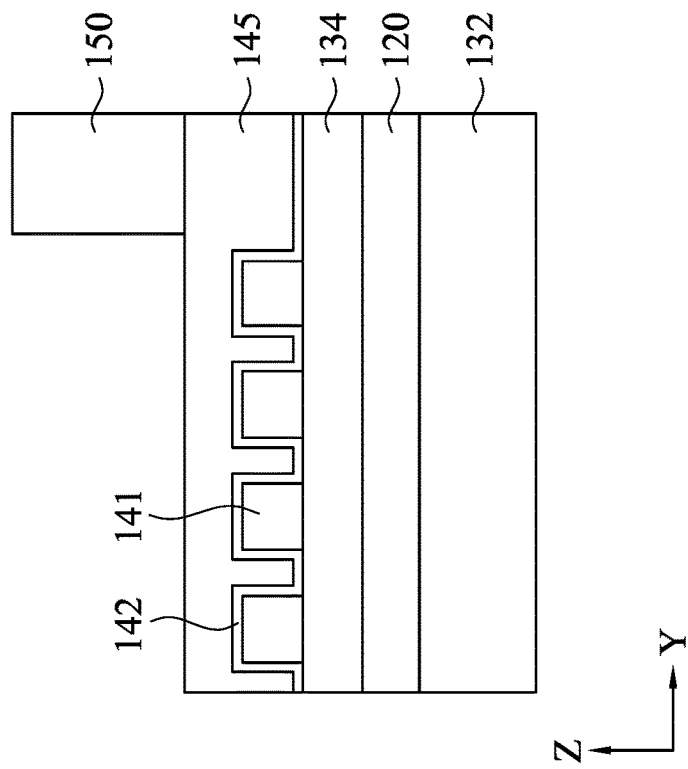
FIGS. 7B, 7C and 7D show cross sectional views of a back side power supply circuit according to an embodiment of the present disclosure.
Figure 7B:
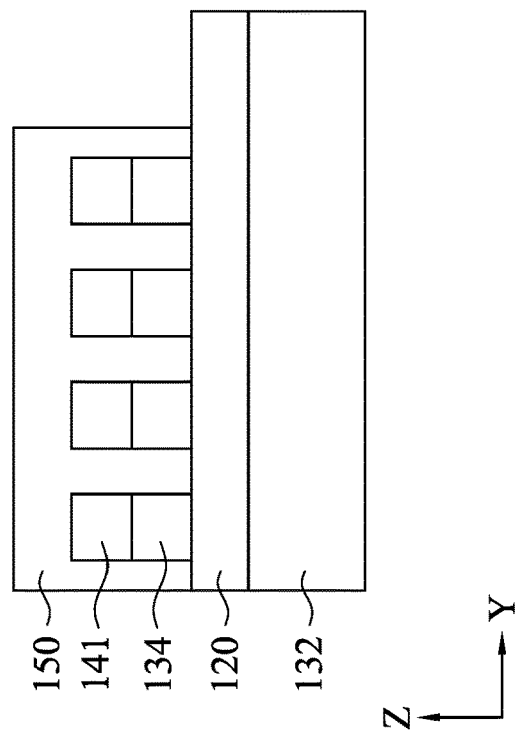
Figure 7D:
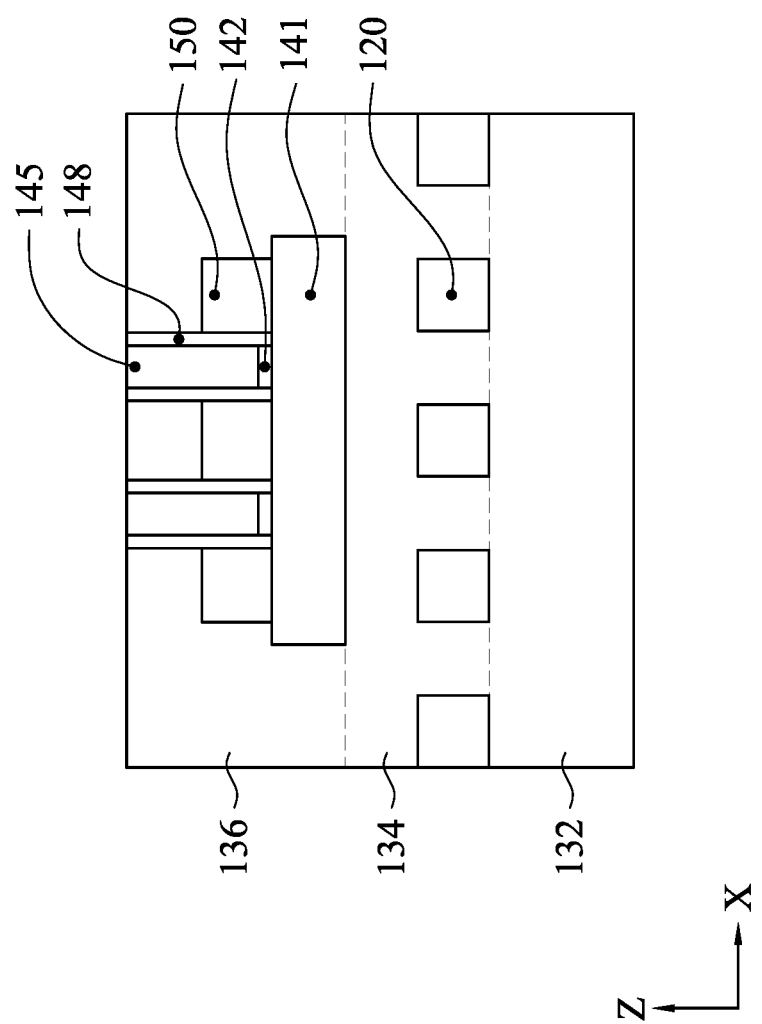

FIG. 7A shows a layout of a back side power supply circuit according to an embodiment of the present disclosure. FIGS. 7B, 7C and 7D show cross sectional views of a back side power supply circuit according to an embodiment of the present disclosure. FIG. 7B corresponds to the lines Y3-Y3 of FIG. 7A, FIG. 7C corresponds to the line Y4-Y4 of FIG. 7A, and FIG. 7D corresponds to the line X5-X5 of FIG. 7A. Materials, configurations, dimensions, processes and/or operations as explained with respect to the foregoing embodiments may be employed in the following embodiments, and the detailed description thereon may be omitted. In FIG. 7A, TSVs are omitted.

In the embodiments of FIGS. 7A-7D, the semiconductor layer includes a plurality of stripe or fin shaped semiconductor layers 141 as shown in FIG. 7A. In some embodiments, the width W of the stripe shaped semiconductor layers 141 is in a range from about 10 nm to about 100 nm, and the space between adjacent semiconductor layers 141 is in a range from about 10 nm to about 40 nm. The thickness of the semiconductor layers 141 is in a range from about 10 nm to about 40 nm in some embodiments.

In the configuration of this embodiment, as shown in FIG. 7B, a contact area of the source/drain contact 150 to the wiring 120 is larger compared with the structure shown in FIG. 4B. Further, by using a stripe or fin shaped semiconductor layers 141, the gate control can be enhanced compared with the structure of FIGS. 4A-4D.

FIGS. 8, 9, 10, 11A, 11B, 12A and 12B show layouts of a front side circuit and a back side power supply circuit according to an embodiment of the present disclosure.

Figure 8:
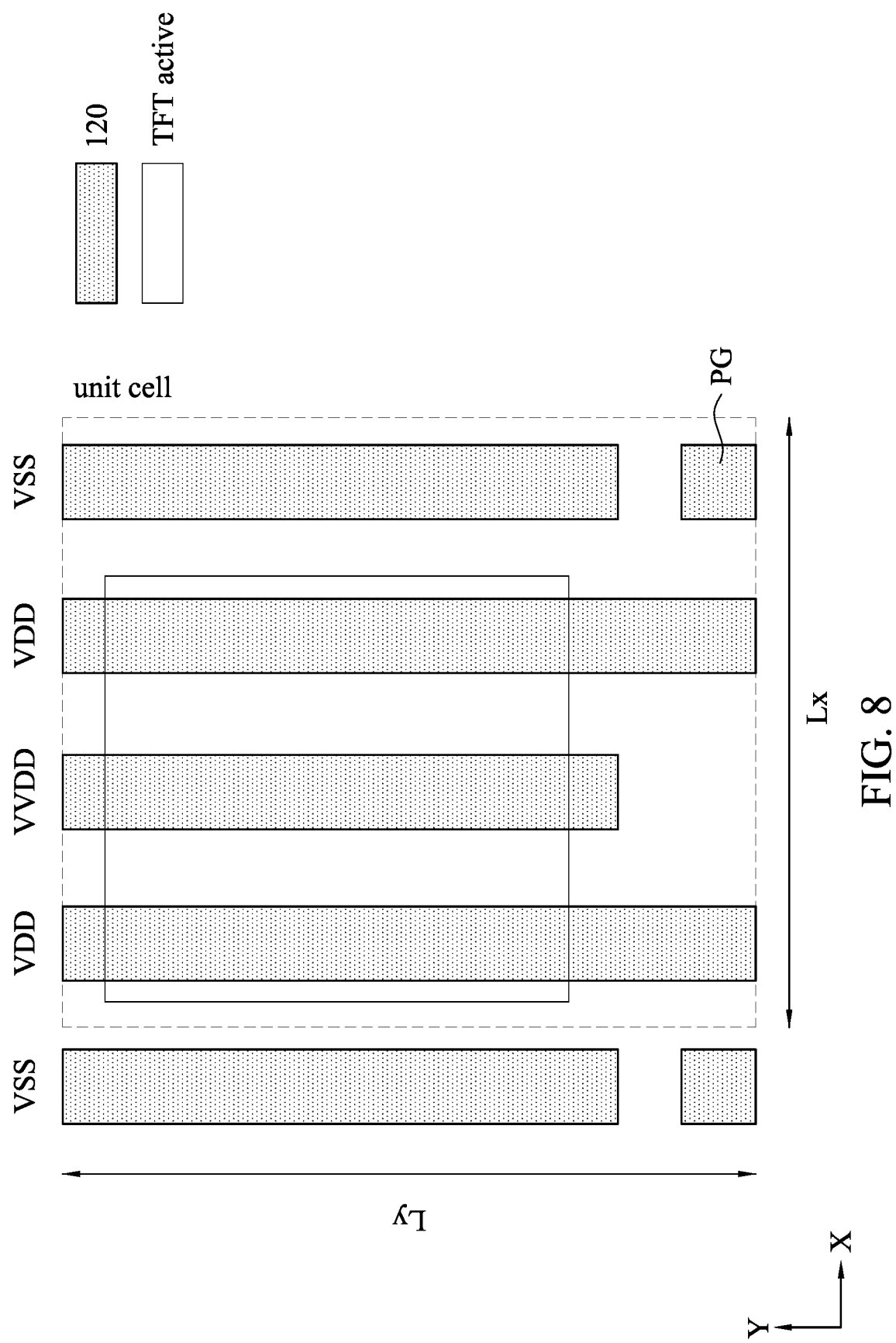
FIGS. 8, 9, 10, 11A, 11B, 12A and 12B show layouts of a front side circuit and a back side power supply circuit according to an embodiment of the present disclosure.

FIG. 8 shows a layout illustrating the power supply wirings VDD, VVDD and VSS, the gate contact pad PG and a TFT region. The unit cell is a region of the front side circuit which is supplied with power through the local power supply wiring VVDD controlled by one gate control signal provided through one gate contact pad PG. In some embodiments, the size Lx of the unit cell along the X direction is in a range from about 240 nm to about 400 nm depending on the design rule of the front side circuit. The size Ly of the unit cell along the Y direction is in a range from about 1 μm to about 20 μm in some embodiments.

Figure 9:
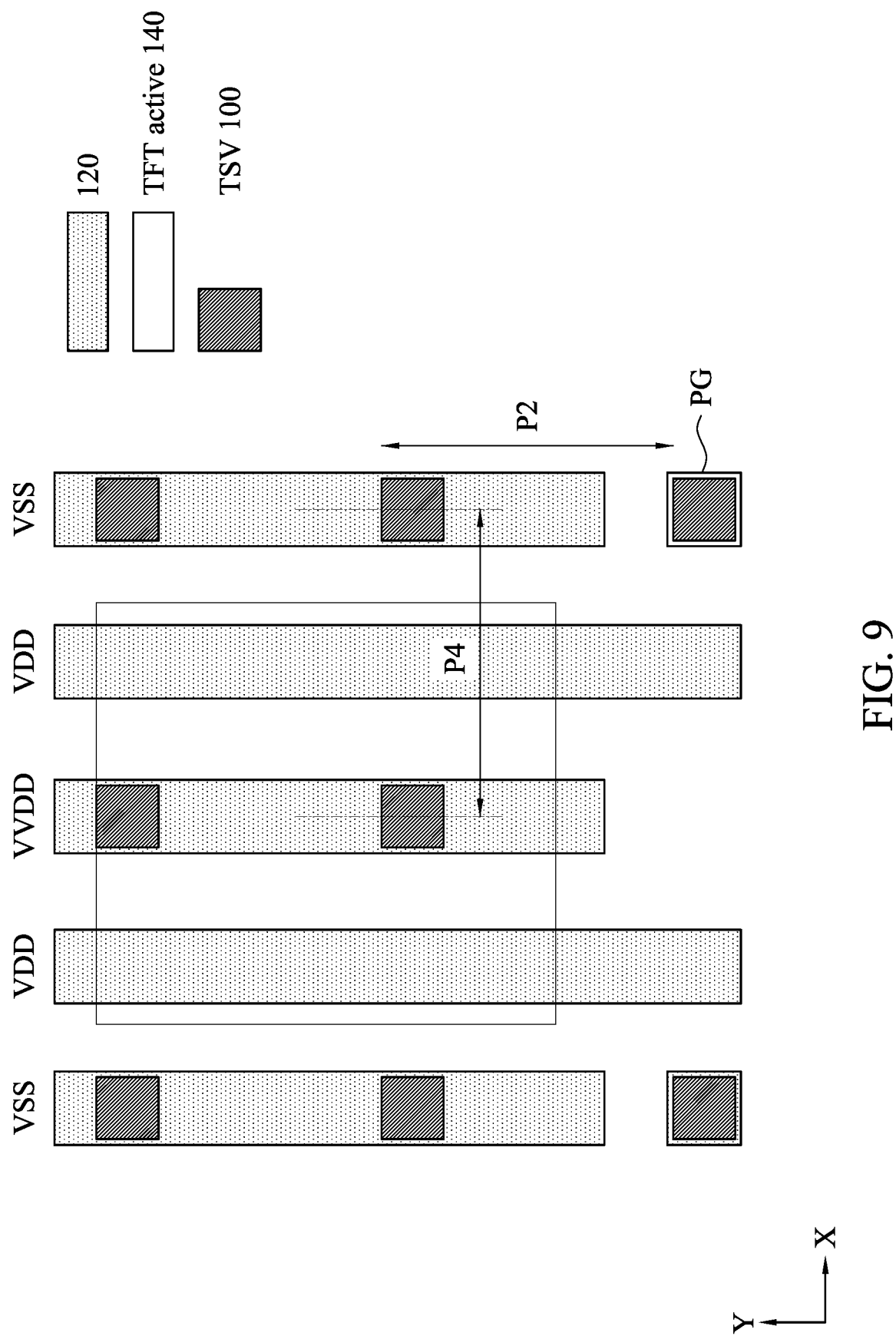

FIG. 9 shows a layout illustrating TSVs 100 together with the power supply wirings VDD, VVDD and VSS, the gate contact pad PG and a TFT region. In some embodiments, the TSVs 100 are arranged in a matrix having an X-direction pitch P4 and a Y-direction pitch P2. The pitch P4 is equal to the pitch of the power supply wirings 120. In some embodiments, P2=P4. In some embodiments, the pitch P2 is in a range from about 120 nm to about 480 nm. No TSV is provided under the first main power supply wirings VDD.

Figure 10:
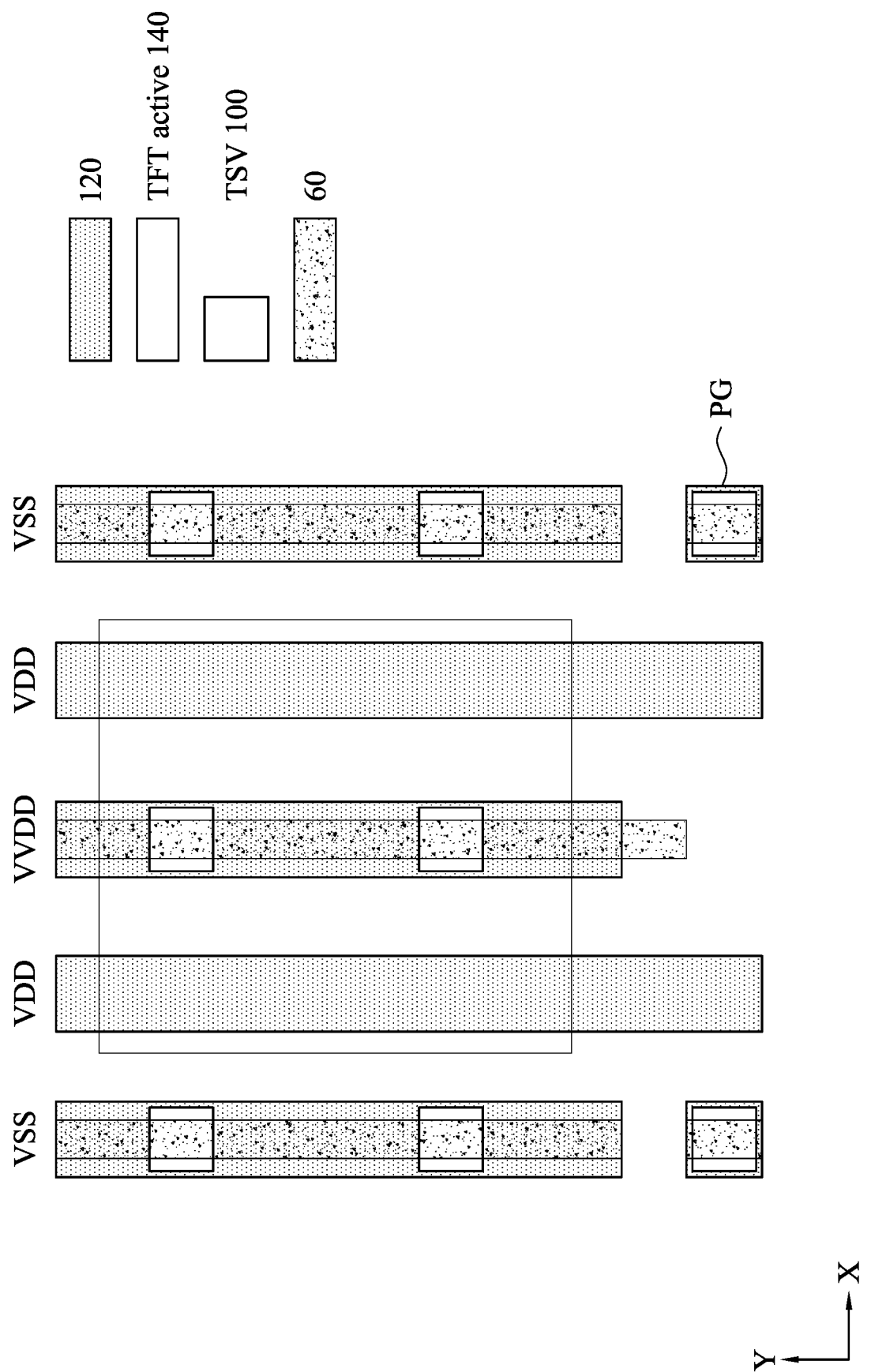

FIG. 10 shows a layout illustrating buried conductive wirings 60 formed at the front side of the substrate together with TSVs 100, the power supply wirings VDD, VVDD and VSS, the gate contact pad PG and a TFT region. The buried conductive wirings 60 overlap the local power supply line VVDD and the second main power supply lines VSS. In addition, an island piece of the buried conductive wirings 60 is disposed to overlap the gate contact pad PG.

Figure 11A:
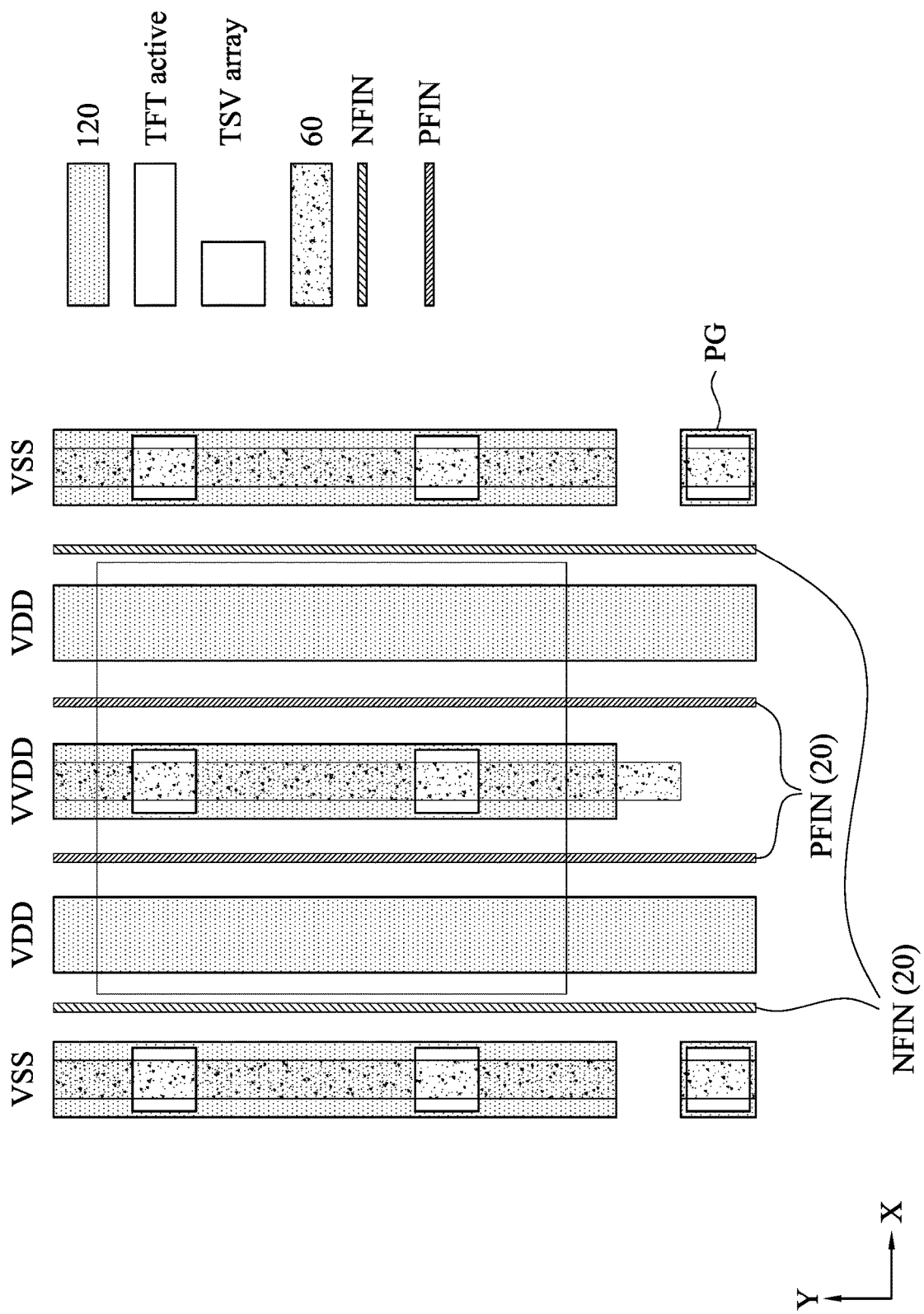
Figure 11B:
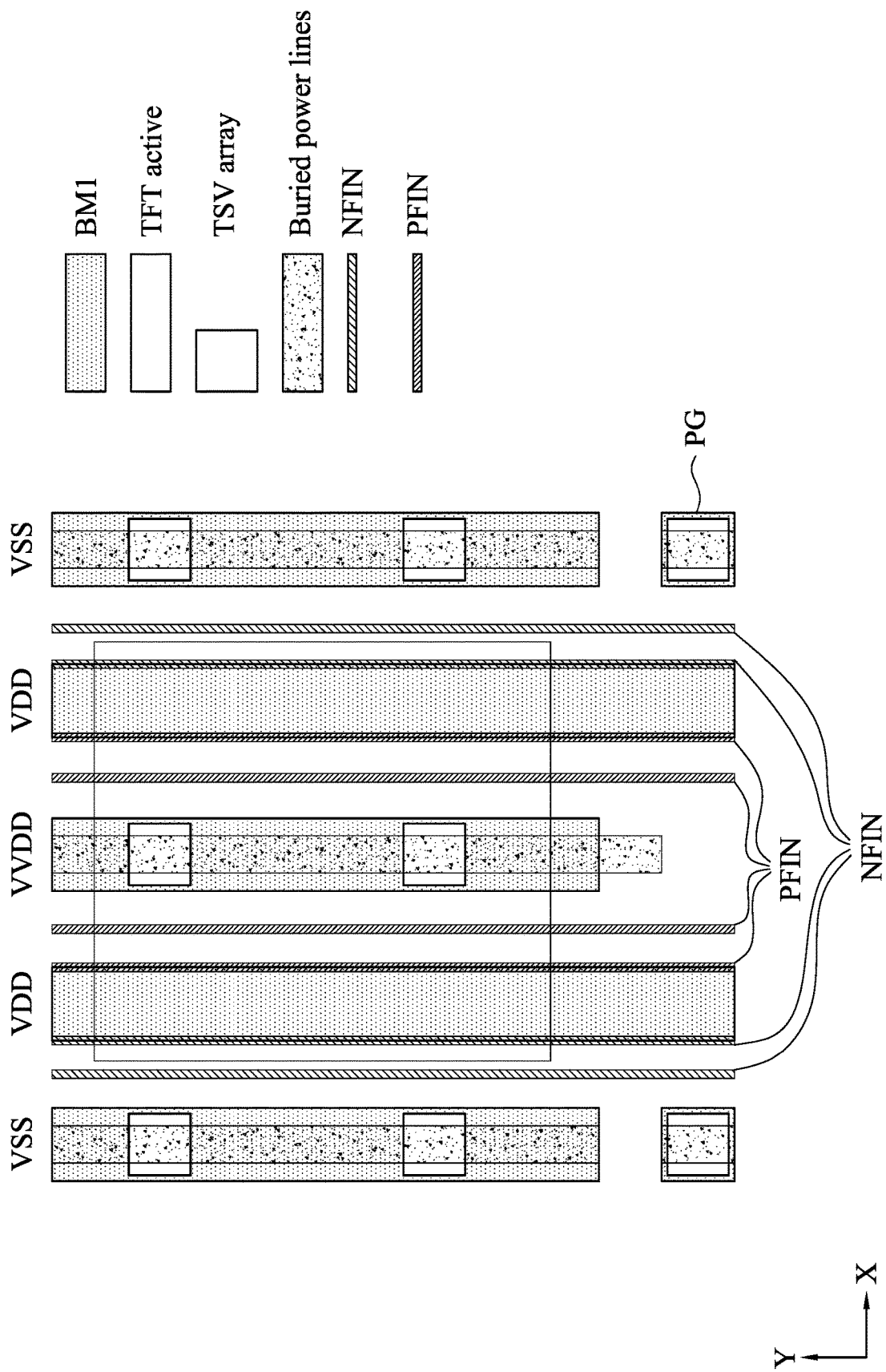

FIGS. 11A and 11B show layouts further illustrating fin structures formed at the front side of the substrate together with the buried conductive wirings 60, TSVs 100, the power supply wirings VDD, VVDD and VSS, the gate contact pad PG and a TFT region. As shown in FIGS. 11A and 11B, the fin structures 20 includes fin structures NFIN for n-type FinFETs, and fin structures PFIN for p-type FinFETs. As shown in FIG. 11A, each of the fin structures is provided at a corresponding area between two adjacent power supply wirings 120. In FIG. 11A, a pair of one n-type fin structure NFIN and one p-type fin structure PFIN is disposed at a corresponding area between the local power supply line VVDD and the second main power supply line VSS and sandwiches the first main power supply line VDD in plan view.

In FIG. 11B, a set of two n-type fin structures NFIN and two p-type fin structures PFIN are disposed at a corresponding area between the local power supply line VVDD and the second main power supply line VSS and sandwiches the first main power supply line VDD in plan view, to provide a higher current capacity.

Figure 12A:
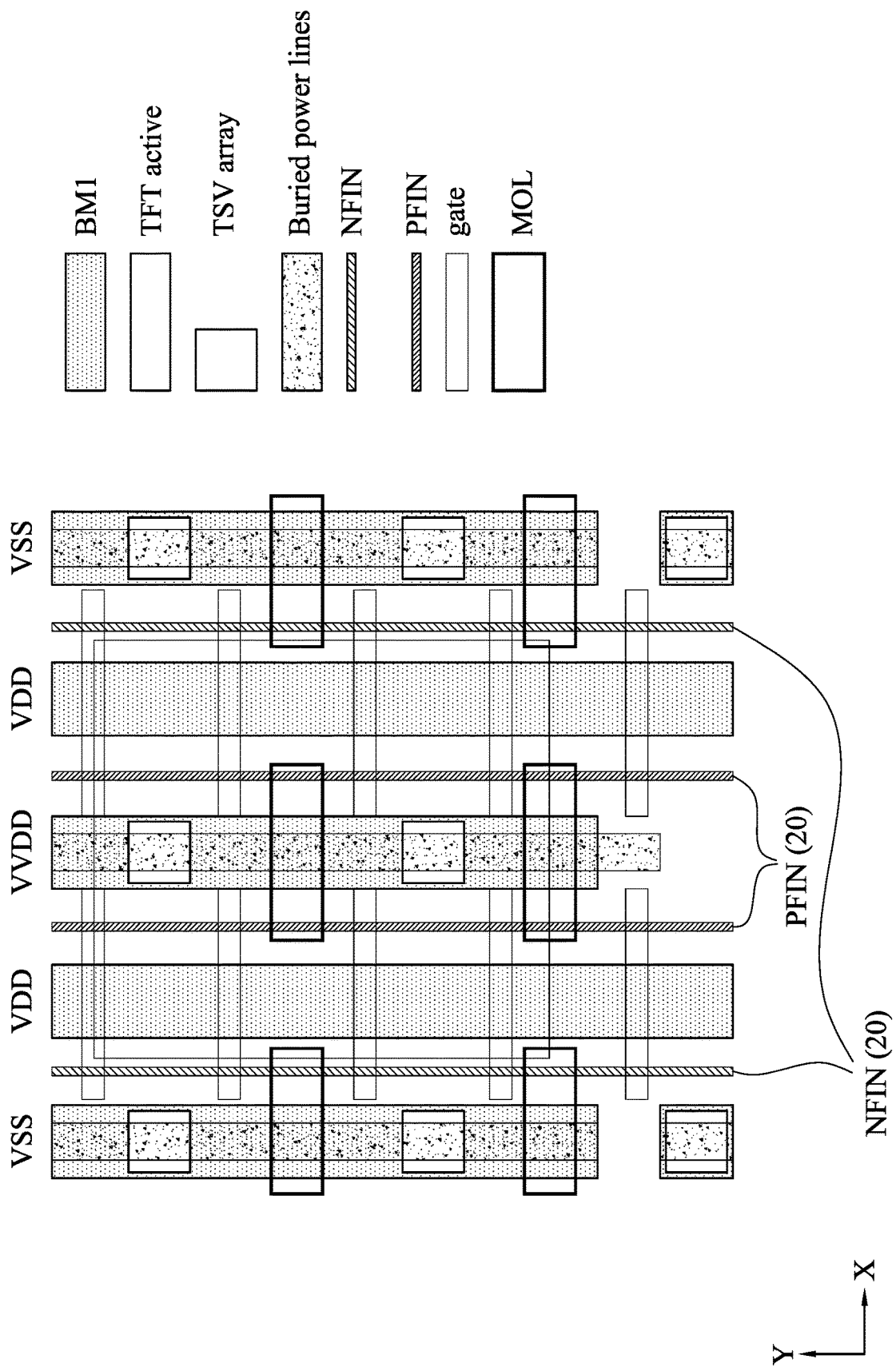
Figure 12B:
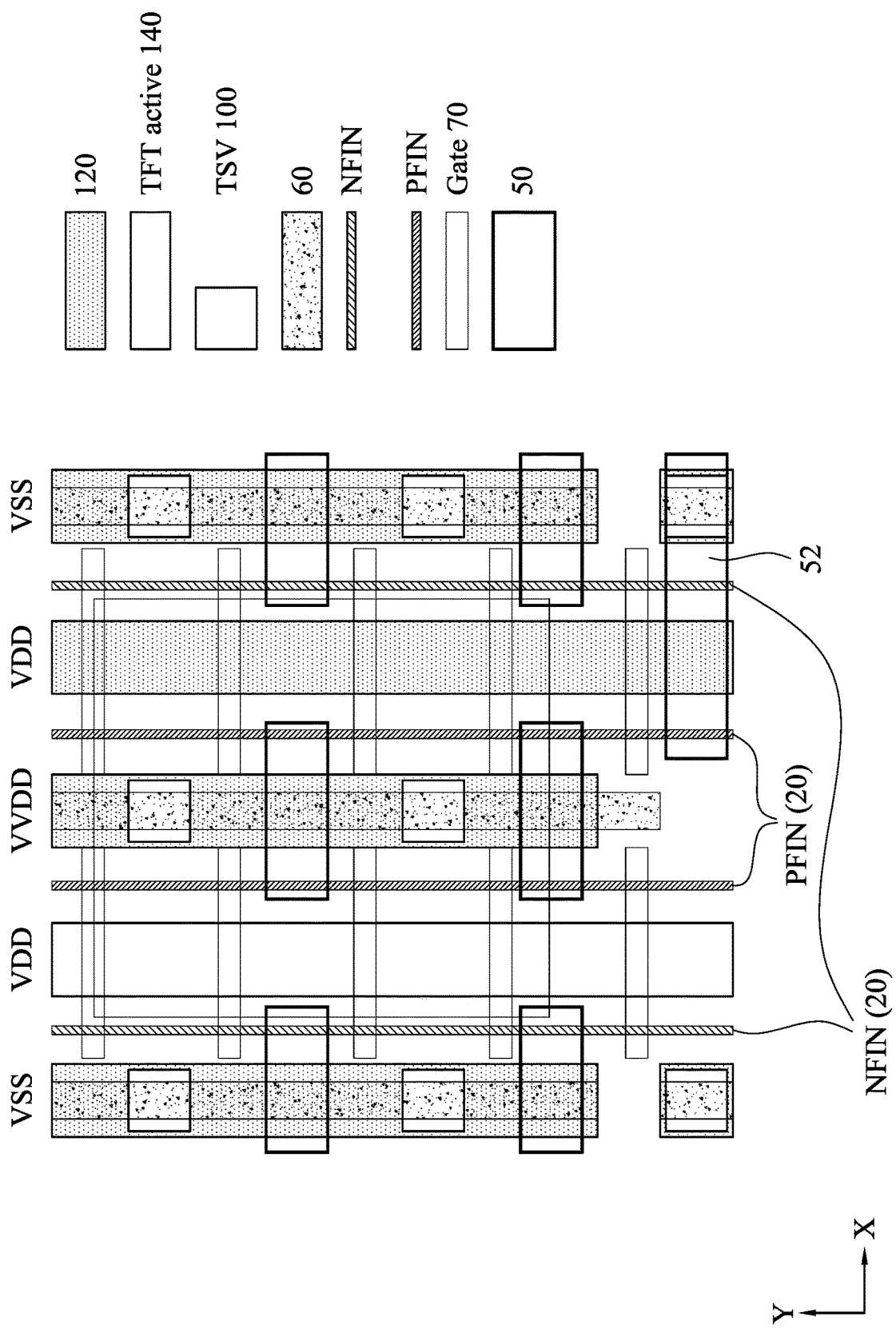

FIGS. 12A and 12B show layouts further illustrating front side gate electrodes 70 and front side source/drain contact patterns 50. The local power supply wiring VVDD on the back side of the substrate is coupled to the buried conductive wiring 60 at the front side through TSVs 100 and the buried conductive wiring 60 is coupled to p-type fins PFIN through the source/drain contact patterns 50. The second main power supply wiring VSS on the back side of the substrate is coupled to the buried conductive wiring 60 at the front side through TSVs 100 and the buried conductive wiring 60 is coupled to n-type fins NFIN through the source/drain contact patterns 50.

Further, in some embodiments, the gate contact pad PG on the back side of the substrate is coupled to the island pattern of the buried conductive wiring 60 at the front side through a TSV 100 and the island buried conductive wiring 60 is coupled to a p-type fin PFIN and an n-type fin NFIN through the source/drain contact patterns 52 to receive a gate control signal.

By using the gate control signal, the TFT on the back side of the substrate is turned on and off to connect and disconnect the first main power supply wiring VDD and the local power supply wiring VVDD. When the TFT is turned on, electric power (e.g., a positive potential) supplied from a VDD source circuit is supplied to the local power supply wiring VVDD via the first main power supply wiring VDD and is further supplied to the CMOS circuits (e.g., standard cells) on the front side of the substrate via the TSVs and buried conductive wires. Since the TFT switch and power supply wirings are located at the back side of the substrate, it is possible to reduce a cell height of the standard cells.

FIGS. 13A-17B shows a sequential manufacturing operation for buried conductive wirings 60 according to an embodiment of the present disclosure. It is understood that additional operations can be provided before, during, and after the processes shown by FIGS. 13A-17B, and some of the operations described below can be replaced or eliminated, for additional embodiments of the method. The order of the operations/processes may be interchangeable. The semiconductor layers and substrate are crystalline, unless otherwise explained.

Figure 13A:
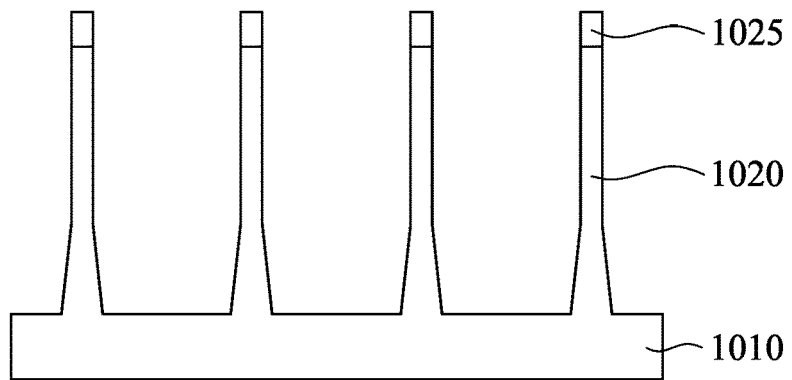
FIGS. 13A, 13B and 13C show cross sectional views illustrating a manufacturing operation of a buried power lines of a front side circuit according to an embodiment of the present disclosure.

As shown in FIG. 13A, a front side circuit 1000 (see, FIG. 18A) is formed over a front surface of the main substrate 1010. The front side circuit 1000 includes one or more fin structures 1020 formed over the semiconductor substrate 1010. In some embodiments, the substrate 1010 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenide phosphide (GaAsP), or gallium indium phosphide (GaInP)), or the like. Further, the substrate 1010 may include an epitaxial layer (epi-layer), which may be strained for performance enhancement, and/or may include a buried dielectric layer to form a silicon-on-insulator (SOI) structure.

The fin structures 1020 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned into a mandril using a photolithography process. Spacers are formed alongside the mandril using a self-aligned process. The mandril is then removed, and the remaining spacers may then be used to pattern the fin structures. The multi-patterning processes combining photolithography and self-aligned processes generally result in forming a pair of fin structures. In FIG. 13A, four fin structures 1020 are illustrated. However, the number of the fin structures is not limited to four. In some embodiments, one or more dummy fin structures are formed adjacent to the fin structure 1020 of an active FinFET. FIG. 13A also shows a hard mask 1025 used to pattern the fin structures 1020.

Figure 13B:
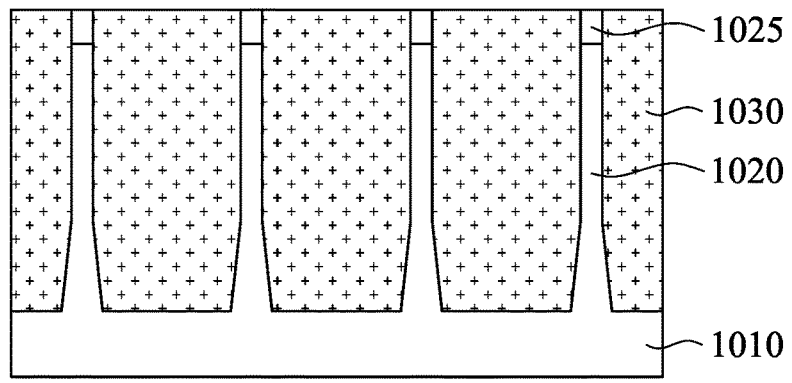

Then, as shown in FIG. 13B, an insulating layer for shallow trench isolation (STI) is formed to embed the fin structures 1020 therein. The insulating layer 1030 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 1030 can be formed by one or more layers of SOG, SiO, SiON, SiOCN or fluorine-doped silicate glass (FSG) in some embodiments. Prior to forming the isolation insulating region 1030, one or more liner layers (not shown) are formed over the substrate 1010 and sidewalls of the bottom part of the fin structures 1020, in some embodiments.

Figure 13C:
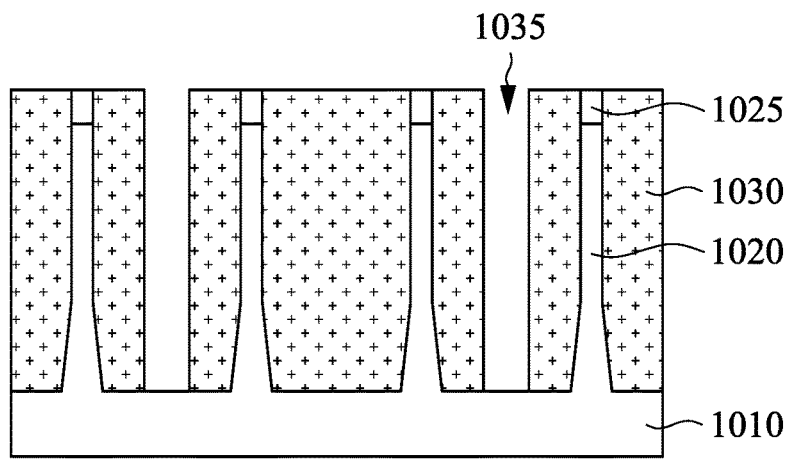

Next as shown in FIG. 13C, trench openings 1035 are formed in the isolation insulating layer 1030 by using one or more lithography and etching operations.

Figure 14A:
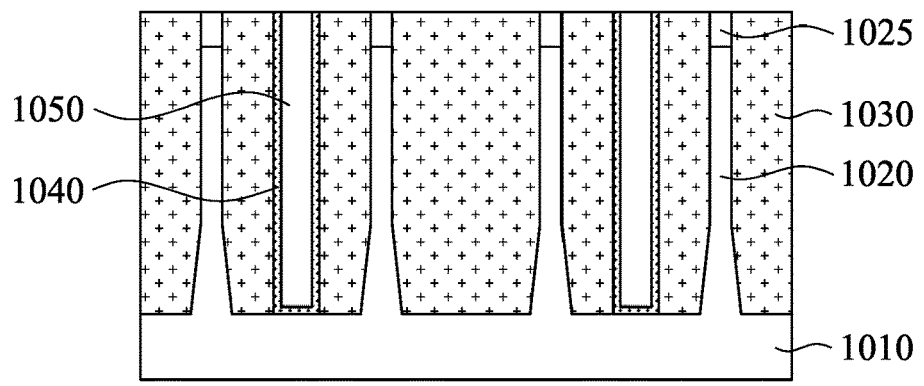
FIGS. 14A, 14B and 14C show cross sectional views illustrating a manufacturing operation of a buried power lines of a front side circuit according to an embodiment of the present disclosure.

In some embodiments, after a liner insulating layer 1040 is formed in the trench opening, a conductive material 1050 is filled in the trench opening as shown in FIG. 14A. The liner layer 1040 includes one or more of silicon oxide, silicon nitride, SiON, SiOC, SiOCN or any other suitable material. The conductive material 1050 includes one or more conductive materials, such as doped poly silicon, W, Cu, Ti, Ag, Al, TiAl, TiAlN, TaC, TaCN, TaSiN, Mn, Co, Mo, Pd, Ni, Re, Ir, Ru, Pt, and Zr, formed by ALD, PVD, CVD, plating or any other suitable methods. After the conductive material 1050 is formed a planarization operation, such as a chemical mechanical polishing (CMP) operation is performed.

Figure 14B:
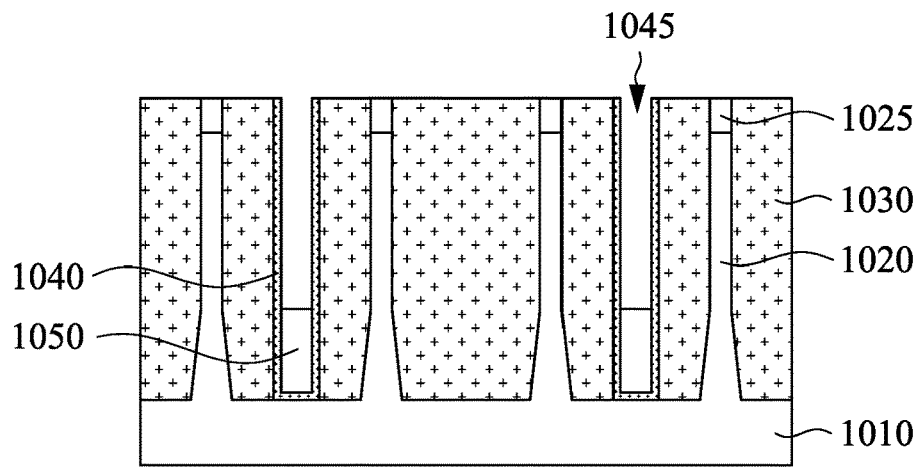
Figure 14C:
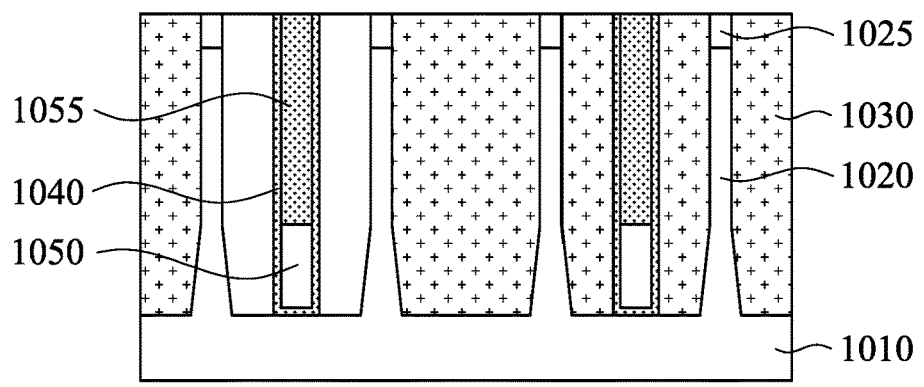

Subsequently, as shown in FIG. 14B, the conductive material 1050 is recessed down to a given depth to form upper openings 1045. The upper openings 1045 are filled with an insulating material 1055 as shown in FIG. 14C. The insulating material 1055 includes one or more of silicon oxide, silicon nitride, SiON, SiOC, SiOCN or any other suitable material.

Figure 15A:
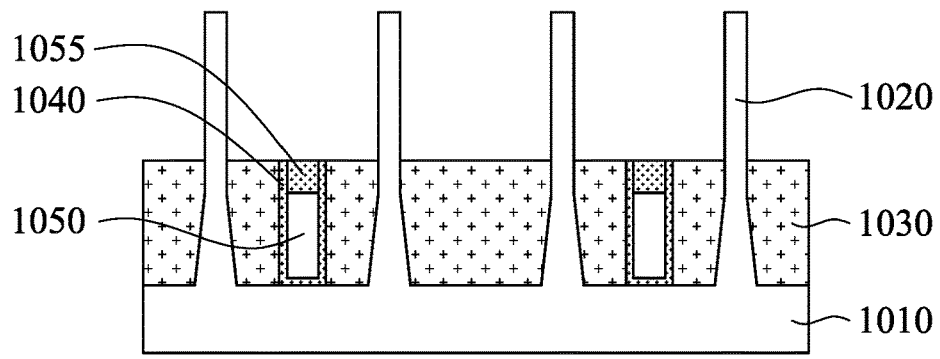
FIGS. 15A, 15B and 15C show various views illustrating a manufacturing operation of a buried power lines of a front side circuit according to an embodiment of the present disclosure.
Figure 15B:
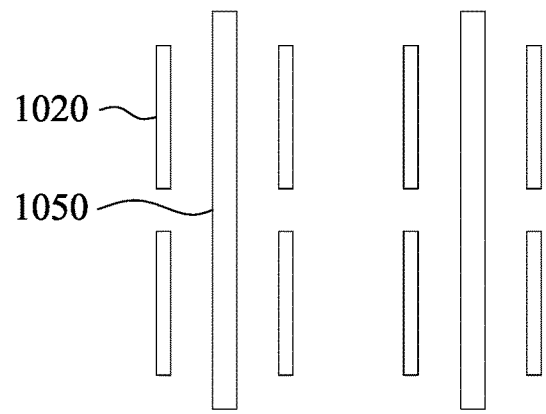
Figure 15C:
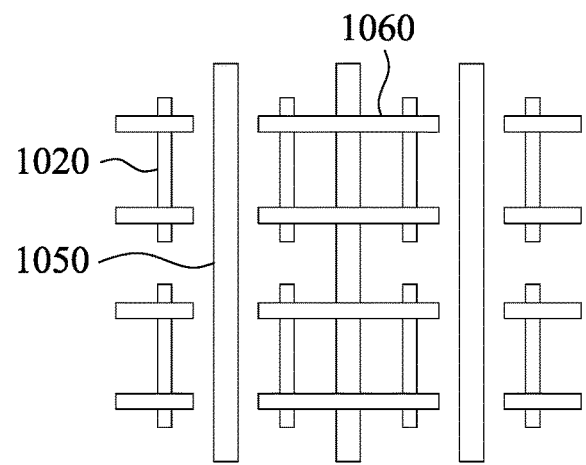

After the insulating material 1055 is formed, an etch back operation is performed to expose the upper portion of the fin structures 1020. In some embodiments, the isolation insulating layer 1030, the liner layer 1040 and the insulating material 1055 are recessed using a single etch process, or multiple etch processes, including a dry etch, a chemical etch, or a wet cleaning process. As shown in FIG. 15A, part of the insulating material 1055 remains on the conductive material 1050, which corresponds to a buried conductive wiring 60. FIG. 15B shows a plan view after the buried conductive wirings 1050 (60) are formed. Next, as shown in FIG. 15C, one or more gate electrodes 1060 are formed. In some embodiments, the gate electrodes 1060 are sacrificial gate electrodes, which are subsequently replaced with metal gate electrodes.

After the gate electrodes 1060 are formed, the fin structures 1020 at the source/drain regions are recessed and then source/drain epitaxial layers 1070 are formed. The materials used for the source/drain epitaxial layer 1070 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. In some embodiments, boron (B) is doped in the source/drain epitaxial layer for the p-type FinFETs. Other materials can be used. In some embodiments, the source/drain epitaxial layer 1070 includes two or more epitaxial layers with different compositions and/or different dopant concentrations. The source/drain epitaxial layer 1070 can be formed by CVD, ALD, molecular beam epitaxy (MBE), or any other suitable methods.

After the source/drain epitaxial layer 1070 is formed, an interlayer dielectric (ILD) layer 1080 is formed. In some embodiments, before forming the ILD layer, an etch stop layer (not shown) is formed over the source/drain epitaxial layer 1070 and the gate electrodes 1060. The etch stop layer is made of silicon nitride or a silicon nitride-based material (e.g., SiON, SiCN or SiOCN). The materials for the ILD layer include compounds comprising Si, O, C and/or H, such as silicon oxide, SiCOH and SiOC. Organic materials, such as polymers, may be used for the ILD layer 1080. After the ILD layer 1080 is formed, a planarization operation, such as an etch-back process and/or a chemical mechanical polishing (CMP) process, is performed.

Figure 16A:
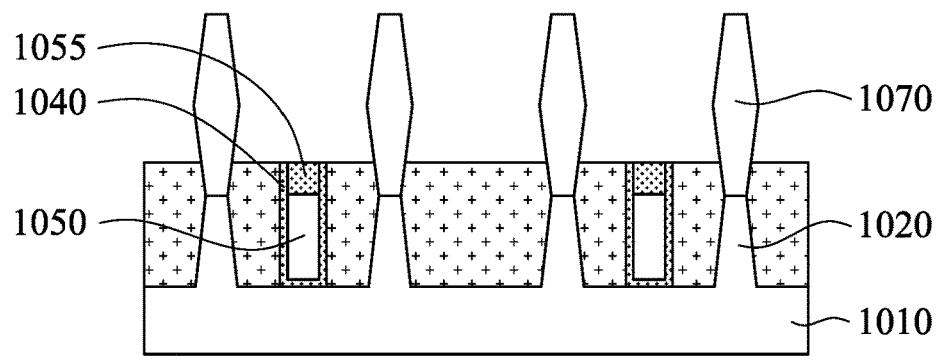
FIGS. 16A, 16B and 16C show cross sectional views illustrating a manufacturing operation of a buried power lines of a front side circuit according to an embodiment of the present disclosure.
Figure 16B:
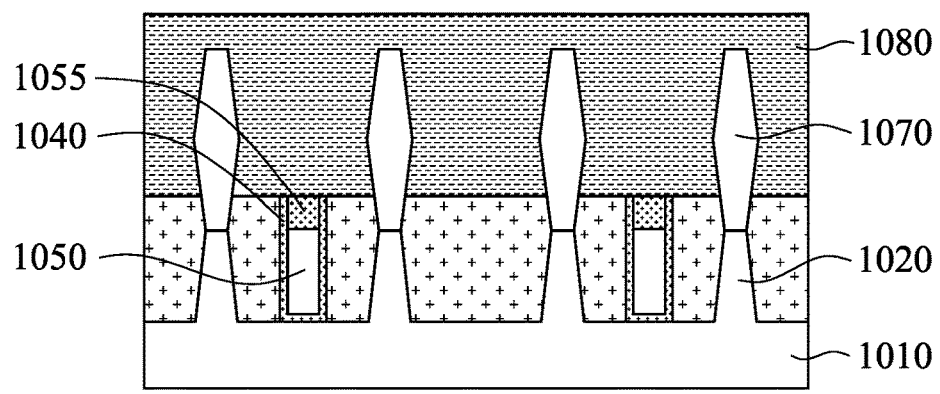
Figure 16C:
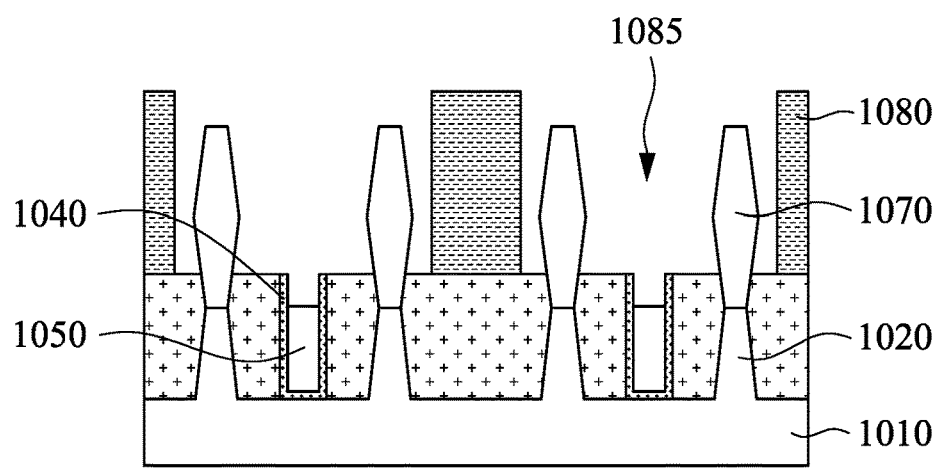
Figure 17A:
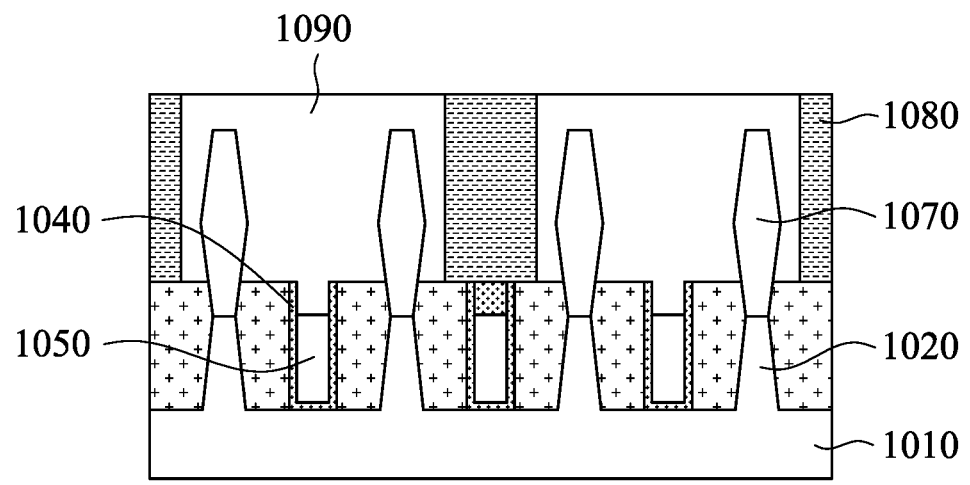
FIGS. 17A and 17B show various views illustrating a manufacturing operation of a buried power lines of a front side circuit according to an embodiment of the present disclosure.
Figure 17B:
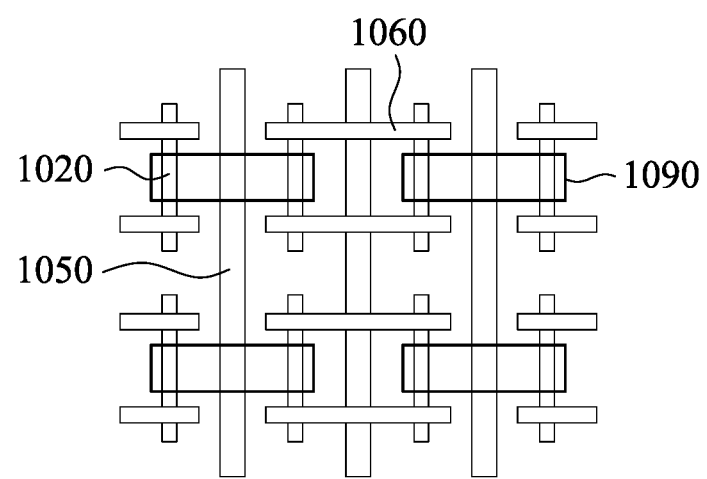

Then, as shown in FIG. 16C, the ILD layer 1080 is patterned to expose part of the source/drain epitaxial layer 1070 to form openings 1085 by using one or more lithography and etching operations. In this etching, the insulating material 1050 is also removed and thus the buried conductive wire 60 is exposed in the opening 1085. The openings 1085 are filled with a conductive material 1090 as show in FIG. 17A. The conductive material 1090 connects the source/drain epitaxial layer 1070 and the buried conductive wiring 1050. The conductive material 1090 corresponds to the source/drain contact pattern 50 or 52. FIG. 17B shows a plan view after the source/drain contact patterns 1090 (50/52) are formed. When the gate electrodes 1060 are sacrificial gate electrodes, a gate replacement operation is performed to replace the sacrificial gate electrodes with metal gate electrodes.

FIGS. 18A-19C shows a sequential manufacturing operation for the back side power supply circuit and TSVs according to an embodiment of the present disclosure. It is understood that additional operations can be provided before, during, and after the processes shown by FIGS. 18A-19C, and some of the operations described below can be replaced or eliminated, for additional embodiments of the method. The order of the operations/processes may be interchangeable.

After the gate electrodes (metal gate electrode) are formed, an interconnect layer 1100 comprising multiple levels of metal wiring structures embedded in ILD is formed over the gate electrodes. As shown in FIG. 18A, a second substrate 1210 (e.g., Si) with an insulating layer 1220 (e.g., silicon oxide) is attached to the top of the multiple layer metal wiring structure 1100 (an insulating layer). Then, the combined structure is flipped, and as shown in FIGS. 18B and 18C, the back side of the substrate 1010 is thinned by, for example, etch-back or CMP.

Figure 19C:
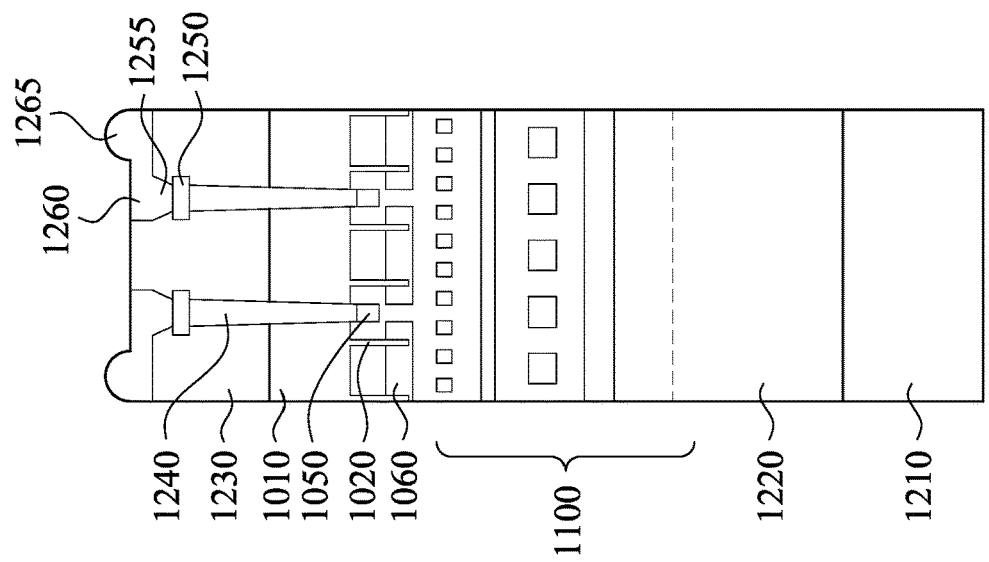
FIGS. 19A, 19B and 19C show cross sectional views illustrating a manufacturing operation of a semiconductor device with a backside power supply circuit according to an embodiment of the present disclosure.
Figure 19B:
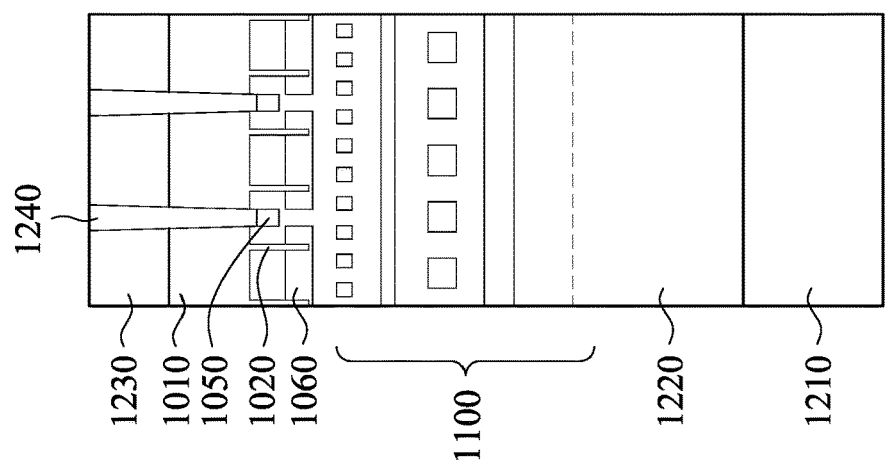
Figure 19A:
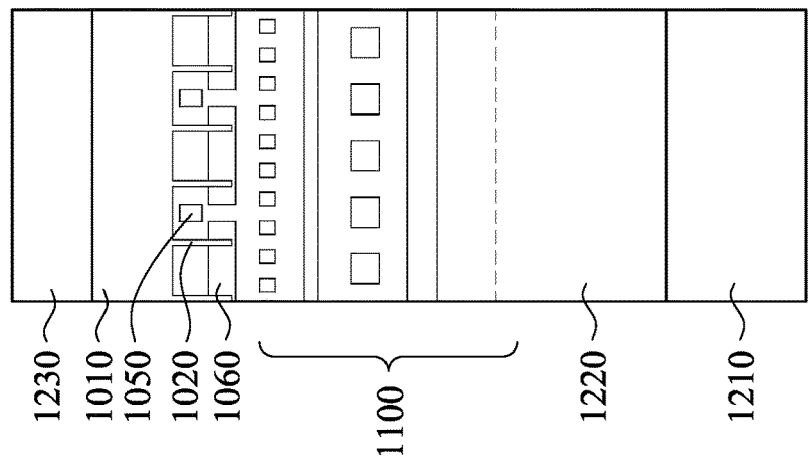

After the substrate 1010 is thinned, a first back side ILD layer 1230 (corresponding to ILD layer 132 in some embodiments) is formed as shown in FIG. 19A. Then, by using one or more lithography and etching operations, via holes for TSVs are formed passing through the first back side ILD layer 1230 and the thinned substrate 1010, and the holes are filled with conductive material to form TSVs 1240 (corresponding to TSV 100) as shown in FIG. 19B. The TSVs 1240 are coupled to the buried conductive wirings 1050. Subsequently, power supply wirings 1250 (corresponding to wirings 120) and one or more TFTs (not shown) are formed as shown in FIG. 19C. Further, in some embodiments, additional back side wirings 1260 connected to the wirings 1250 through back side vias 1255 are formed, and electrodes (bump) 1265 are formed to connect outside circuitry.

Figure 20:
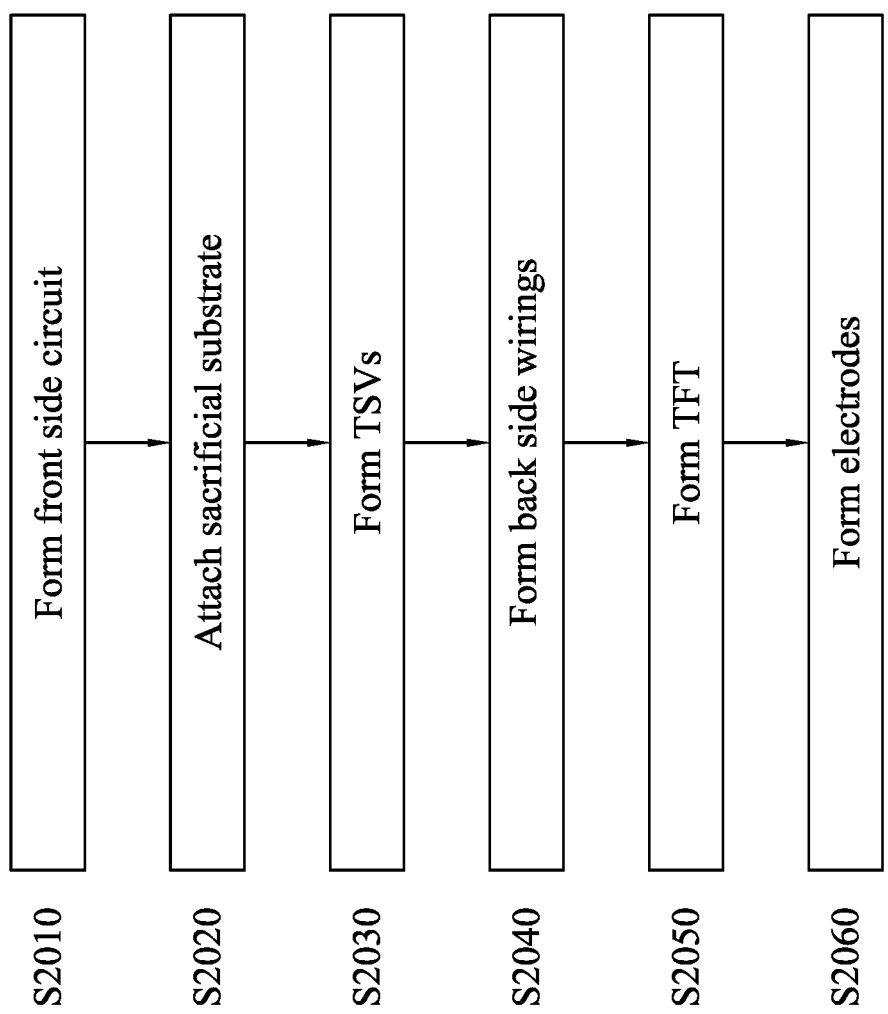
FIG. 20 shows a flow of a manufacturing operation of a semiconductor device with a backside power supply circuit according to an embodiment of the present disclosure.

FIG. 20 shows a flow of a manufacturing operation of a semiconductor device with a backside power supply circuit according to an embodiment of the present disclosure. It is understood that additional operations can be provided before, during, and after the process flow shown by FIG. 20, and some of the operations described below can be replaced or eliminated, for additional embodiments of the method. The order of the operations/processes may be interchangeable. Materials, configurations, dimensions, processes and/or operations as explained with respect to the foregoing embodiments may be employed in the following embodiments, and the detailed description thereon may be omitted.

At S2010, a front side circuit is manufactured on a first substrate. The front side circuit includes FinFETs, buried conductive wirings and a multi-layer wiring interconnect structure as set forth above. Then at S2020, a second substrate with an insulating layer is attached to the front side of the first substrate and the first substrate is thinned. At S2030, TSVs are formed to be connected to the buried conductive wirings. In some embodiments, some of the TSVs are connected to other circuit elements than the buried conductive wirings. At S2040, the back side power supply wirings are formed. After the power supply wirings are formed, one or more ILD layers are formed and then, TFTs are formed at S2050. Further, the TFTs are covered by one or more ILDs and at S2060, electrodes to be connected to outside and other wirings are formed.

In the foregoing embodiments, a TFT switch is provided between the first main power supply wiring VDD and the local power supply wiring VVDD. In other embodiments, alternatively or in addition to the foregoing embodiments, a TFT switch is provided between the second main power supply wiring VSS and a local power supply VVSS (see FIG. 1). One of ordinary skill in the art would understand how to modify the circuits and/or structures as set forth above to realize a TFT switch provided between the second main power supply wiring VSS and a local power supply VVSS.

In the present embodiments, since the TFT switch for switching power supply from the main power supply (VDD or VSS) to the local power supply (VVDD or VVSS) and power supply wirings are located at the back side of the substrate, it is possible to reduce a cell height of the standard cells.

It will be understood that not all advantages have been necessarily discussed herein, no particular advantage is required for all embodiments or examples, and other embodiments or examples may offer different advantages.

In accordance with an aspect of the present disclosure, a semiconductor device includes a substrate, a main circuit disposed over a front surface of the substrate, and a backside power delivery circuit disposed over a back surface of the substrate. The backside power delivery circuit includes a first back side insulating layer disposed over the back surface of the substrate, a first main power supply wiring for supplying a first voltage, a second main power supply wiring for supplying a second voltage, a first local power supply wiring, and a first switch coupled to the first main power supply wiring and the first local power supply wiring. The first main power supply wiring, the second main power supply wiring and the first local power supply wiring are embedded in the first back side insulating layer. The first local power supply wiring is coupled to the main circuit via a first through-silicon via (TSV) passing through the substrate for supplying the first voltage. In one or more of the foregoing and/or following embodiments, the switch is a thin film transistor (TFT) including a semiconductor film having a channel region, a source region and a drain region and disposed on the first back side insulating layer, a gate dielectric layer disposed over the channel region, a gate electrode disposed over the gate dielectric layer, a source contact disposed on the source region and contacting the first main power supply wiring, and a drain contact disposed on the drain region and contacting the first local power supply wiring. In one or more of the foregoing and/or following embodiments, a height of the source contact measured from the semiconductor film is smaller than a height of the gate electrode measured from the semiconductor film. In one or more of the foregoing and/or following embodiments, a height of the source contact measured from the semiconductor film is equal to a height of the gate electrode measured from the semiconductor film. In one or more of the foregoing and/or following embodiments, the backside power delivery circuit further includes a conductive pad embedded in the first back side insulating layer disposed and coupled to the main circuit via a second TSV, and the conductive pad is connected to the gate electrode. In one or more of the foregoing and/or following embodiments, the first and second main power supply wirings and the first local power supply wiring extend in a first direction, the first main power supply wiring is disposed between the first local power supply wiring and the second main power supply wiring along a second direction crossing the first direction in plan view, and the first main power supply wiring and the conductive pad are aligned in the first direction. In one or more of the foregoing and/or following embodiments, the first and second main power supply wirings and the first local power supply wiring extend in a first direction, the first main power supply wiring is disposed between the first local power supply wiring and the second main power supply wiring along a second direction crossing the first direction in plan view, and the second main power supply wiring and the conductive pad are aligned in the first direction. In one or more of the foregoing and/or following embodiments, the main circuit includes a plurality of semiconductor fins and a first front side insulating layer covering bottom portions of the plurality of semiconductor fins, and a plurality of buried conductive wirings embedded in the first front side insulating layer, and the first TSV is coupled to one of the plurality of buried conductive wirings.

In accordance with another aspect of the present disclosure, a semiconductor device includes a substrate, a main circuit disposed over a front surface of the substrate, and a backside power delivery circuit disposed over a back surface of the substrate. The backside power delivery circuit includes a first back side insulating layer disposed over the back surface of the substrate, a first main power supply wiring for supplying a first voltage, a second main power supply wiring for supplying a second voltage, a third main power supply wiring for supplying the first voltage, a first local power supply wiring, a first switch coupled to the first main power supply wiring and the first local power supply wiring, and a second switch coupled to the third main power supply wiring and the first local power supply wiring. The first, second and third main power supply wirings and the first local power supply wiring are embedded in the first back side insulating layer, and the first local power supply wiring is coupled to the main circuit via a first through-silicon via (TSV) passing through the substrate for supplying the first voltage. In one or more of the foregoing and/or following embodiments, the first, second and third main power supply wirings and the first local power supply wiring extend in a first direction, the first local power supply wiring is disposed between the first main power supply wiring and the third main power supply wiring along a second direction crossing the first direction in plan view, and the first main power supply wiring or the third main power supply wiring is disposed between the first local power supply wiring and the second main power supply wiring. In one or more of the foregoing and/or following embodiments, the backside power delivery circuit includes a semiconductor film disposed on the first back side insulating layer and overlapping the first and third main power supply wiring and the first local power supply wiring in plan view, the first switch and the second switch are a thin film transistor (TFT), the first switch includes a part of a semiconductor film as a channel region, a source region and a drain region, a gate dielectric layer disposed over the channel region, a gate electrode disposed over the gate dielectric layer, a source contact disposed on the source region and contacting the first main power supply wiring, and a drain contact disposed on the drain region and contacting the first local power supply wiring, and the second switch includes another part of a semiconductor film as a channel region, a source region and a drain region, a gate dielectric layer disposed over the channel region, a gate electrode disposed over the gate dielectric layer, a source contact disposed on the source region and contacting the third main power supply wiring, and a drain contact shared with the first switch. In one or more of the foregoing and/or following embodiments, a height of the source contact of each of the first and second switches measured from the semiconductor film is smaller than a height of the gate electrode of each of the first and second switches measured from the semiconductor film. In one or more of the foregoing and/or following embodiments, a height of the source contact of each of the first and second switches measured from the semiconductor film is equal to a height of the gate electrode of each of the first and second switches measured from the semiconductor film. In one or more of the foregoing and/or following embodiments, the backside power delivery circuit further includes a conductive pad embedded in the first back side insulating layer disposed and coupled to the main circuit via a second TSV, and the conductive pad is connected to the gate electrode of each of the first and second switches. In one or more of the foregoing and/or following embodiments, the second main power supply wiring and the conductive pad are aligned in the first direction, the main circuit includes a plurality of semiconductor fins and a first front side insulating layer covering bottom portions of the plurality of semiconductor fins, and a plurality of buried conductive wirings embedded in the first front side insulating layer, and the first TSV is coupled to one of the plurality of buried conductive wirings.

In accordance with another aspect of the present disclosure, a semiconductor device includes a substrate, a main circuit disposed over a front surface of the substrate, and a backside power delivery circuit disposed over a back surface of the substrate. The main circuit includes a plurality of semiconductor fins and a first front side insulating layer covering bottom portions of the plurality of semiconductor fins, a plurality of CMOS FETs, each of which includes a pair of the plurality of semiconductor fins, a gate electrode, and a source/drain region, and a plurality of buried conductive wirings embedded in the first front side insulating layer. The backside power delivery circuit includes a first main power supply wiring for supplying a first voltage, a second main power supply wiring for supplying a second voltage, a first local power supply wiring, and a first switch coupled to the first main power supply wiring and the first local power supply wiring. The second main power supply wiring overlaps one of the plurality of buried conductive wirings and connected thereto by one or more through-silicon vias (TSVs) passing through the substrate, the first local power supply wiring overlaps one of the plurality of buried conductive wirings and connected thereto by one or more TSVs passing the substrate, and no TSV overlaps the first main power supply wiring in plan view. In one or more of the foregoing and/or following embodiments, the plurality of semiconductor fins and the plurality of buried conductive wirings extend in a first direction, the first and second main power supply wirings and the first local power supply wiring extend in the first direction, and the first main power supply wiring is disposed between the first local power supply wiring and the second main power supply wiring along a second direction crossing the first direction in plan view. In one or more of the foregoing and/or following embodiments, the backside power delivery circuit further includes a conductive pad and coupled to the main circuit via a TSV, and the conductive pad is connected to the gate electrode and aligned with the second main power supply wiring in the first direction. In one or more of the foregoing and/or following embodiments, the plurality of semiconductor fins include n-type fins and p-type fins, and the first main power supply wiring is disposed between one n-type fin and one p-type in in plan view.

In accordance with another aspect of the present disclosure, in a method of manufacturing a semiconductor device, a front side circuit is formed at a front side of a first substrate. A second substrate with an insulating layer is attached to a front side of the first substrate. Through-silicon-vias (TSVs) passing through the first substrate are formed to be connected to the front side circuit. Back side power supply wirings are formed. A first interlayer dielectric (ILD) layer is formed over the back side power supply wirings. Thin film transistors are formed over the first ILD layers to switch power supply between one of the back side power supply wirings and another of the back side power supply wirings. In one or more of the foregoing and/or following embodiments, a second ILD layer is formed over the TFTs, and electrodes to be connected to outside and additional wirings are formed. In one or more of the foregoing and/or following embodiments, the front side circuit includes FinFETs, buried conductive wirings and a multilayer wiring structure. In one or more of the foregoing and/or following embodiments, one or more of the TSVs are formed to be connected to one or more of the buried conductive wirings. In one or more of the foregoing and/or following embodiments, one or more of the TSVs are connected to other circuit elements of the front side circuit than the buried conductive wirings.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a main circuit disposed over a front surface of the substrate; and
   a backside power delivery circuit disposed over a back surface of the substrate, wherein:
   the backside power delivery circuit includes:
      a first back side insulating layer disposed over the back surface of the substrate;
      a first main power supply wiring for supplying a first voltage;
      a first local power supply wiring for supplying the first voltage; and
      a first switch coupled to the first main power supply wiring and the first local power supply wiring,
   the first main power supply wiring and the first local power supply wiring are embedded in the first back side insulating layer, and
   the first local power supply wiring is coupled to the main circuit via a first through-silicon via (TSV) passing through the substrate for supplying the first voltage.

2. The semiconductor device of claim 1, wherein the switch is a thin film transistor (TFT) including:
   a semiconductor film having a channel region, a source region and a drain region and disposed on the first back side insulating layer;
   a gate dielectric layer disposed over the channel region;
   a gate electrode disposed over the gate dielectric layer;
   a source contact disposed on the source region and contacting the first main power supply wiring; and a drain contact disposed on the drain region and contacting the first local power supply wiring.

3. The semiconductor device of claim 2, wherein a height of the source contact measured from the semiconductor film is smaller than a height of the gate electrode measured from the semiconductor film.

4. The semiconductor device of claim 2, wherein a height of the source contact measured from the semiconductor film is equal to a height of the gate electrode measured from the semiconductor film.

5. The semiconductor device of claim 2, wherein:
the backside power delivery circuit further includes a conductive pad embedded in the first back side insulating layer disposed and coupled to the main circuit via a second TSV, and
the conductive pad is connected to the gate electrode.

6. The semiconductor device of claim 5, wherein:
the first main power supply wiring and the first local power supply wiring extend in a first direction,
the first main power supply wiring is disposed adjacent to the first local power supply wiring along a second direction crossing the first direction in plan view, and
the first main power supply wiring and the conductive pad are aligned in the first direction.

7. The semiconductor device of claim 2, wherein:
the main circuit includes a plurality of semiconductor fins and a first front side insulating layer covering bottom portions of the plurality of semiconductor fins, and a plurality of buried conductive wirings embedded in the first front side insulating layer, and
the first TSV is coupled to one of the plurality of buried conductive wirings.

8. A semiconductor device, comprising:
a substrate;
a main circuit disposed over a front surface of the substrate; and
a backside power delivery circuit disposed over a back surface of the substrate, wherein:
the backside power delivery circuit includes:
a first main power supply wiring for supplying a first voltage;
a second main power supply wiring for supplying a second voltage;
a first local power supply wiring for supplying the first voltage; and
a first switch coupled to the first main power supply wiring and the first local power supply wiring,
the first local power supply wiring is coupled to the main circuit via a first through-silicon via (TSV) passing through the substrate for supplying the first voltage, and
the second main power supply wiring is coupled to the main circuit via a second TSV passing through the substrate for supplying the second voltage.

9. The semiconductor device of claim 8, wherein no TSV overlaps the first main power supply wiring in plan view.

10. The semiconductor device of claim 9, wherein the backside power delivery circuit further includes a pad electrode couple to the first switch and a third TSV passing through the substrate.

11. The semiconductor device of claim 10, wherein:
the first and second main power supply lines and the first local power supply wiring extend in a first direction, and
the pad electrode and the first main power supply line are aligned in the first direction.

12. The semiconductor device of claim 10, wherein:
the first and second main power supply lines and the first local power supply wiring extend in a first direction, and
the pad electrode and the second main power supply line are aligned in the first direction.

13. The semiconductor device of claim 8, wherein the first TSV comprises multiple TSVs.

14. A semiconductor device, comprising:
a substrate;
a main circuit disposed over a front surface of the substrate; and
a backside power delivery circuit disposed over a back surface of the substrate, wherein:
the backside power delivery circuit includes:
a first back side insulating layer disposed over the back surface of the substrate;
a first main power supply wiring for supplying a first voltage;
a second main power supply wiring for supplying the first voltage;
a first local power supply wiring;
a first switch coupled to the first main power supply wiring and the first local power supply wiring; and
a second switch coupled to the second main power supply wiring and the first local power supply wiring,
the first and second main power supply wirings and the first local power supply wiring are embedded in the first back side insulating layer, and
the first local power supply wiring is coupled to the main circuit via a first through-silicon via (TSV) passing through the substrate for supplying the first voltage.

15. The semiconductor device of claim 14, wherein:
each of the first switch and the second switch is a thin film transistor (TFT) including a gate, a source and a drain,
the source of the first switch is coupled to the first main power supply wiring,
the source of the second switch is coupled to the second main power supply wiring, and
the drain of the first switch and the drain of the second switch are coupled to the first local power supply wiring.

16. The semiconductor device of claim 15, wherein:
the backside power delivery circuit further includes a conductive pad embedded in the first back side insulating layer disposed and coupled to the main circuit via a second TSV, and
the conductive pad is connected to the gate of the first switch and the gate of the second switch.

17. The semiconductor device of claim 16, wherein:
the first main power supply wiring, the second main power supply wiring and the first local power supply wiring extend in a first direction in plan view, and
the first local power supply wiring is disposed between the first main power supply wiring and the second main power supply wiring in plan view.

18. The semiconductor device of claim 17, wherein:
the main circuit includes a plurality of semiconductor fins extending in the first direction and a first front side insulating layer covering bottom portions of the plurality of semiconductor fins, and a plurality of buried conductive wirings embedded in the first front side insulating layer, and
the first TSV is coupled to one of the plurality of buried conductive wirings and the second TSV is coupled to another of the plurality of buried conductive wirings.

19. The semiconductor device of claim 18, wherein:
one of the plurality of fins is disposed between the first main power supply wiring and the first local power supply wiring in plan view, and
another of the plurality of fins is disposed between the second main power supply wiring and the first local power supply wiring in plan view.

20. The semiconductor device of claim 18, wherein the another of the plurality of buried conductive wirings is coupled to two of the plurality of fins.

* * * * *